US012003047B2

(12) United States Patent
Chujo et al.

(10) Patent No.: US 12,003,047 B2
(45) Date of Patent: Jun. 4, 2024

(54) WIRING SUBSTRATE AND INFORMATION PROCESSING DEVICE

(71) Applicant: Hitachi, Ltd., Tokyo (JP)

(72) Inventors: Norio Chujo, Tokyo (JP); Yasuhiro Ikeda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 411 days.

(21) Appl. No.: 17/328,551

(22) Filed: May 24, 2021

(65) Prior Publication Data
US 2022/0013937 A1    Jan. 13, 2022

(30) Foreign Application Priority Data

Jul. 13, 2020  (JP) .................................. 2020-119997

(51) Int. Cl.
*H01R 12/79*    (2011.01)
*H01R 12/59*    (2011.01)
(Continued)

(52) U.S. Cl.
CPC .......... *H01R 12/592* (2013.01); *H01R 12/65* (2013.01); *H05K 1/0237* (2013.01); *H05K 1/147* (2013.01);
(Continued)

(58) Field of Classification Search
CPC .... H01R 12/592; H01R 12/65; H05K 1/0237; H05K 1/147; H05K 3/321;
(Continued)

(56) References Cited

U.S. PATENT DOCUMENTS

2003/0214781 A1    11/2003    Kolb et al.
2006/0141854 A1*    6/2006    Gushiken ........... H01R 12/7076
                                                    439/495
(Continued)

FOREIGN PATENT DOCUMENTS

JP    2006-179821 A    7/2006
JP    2008-171386 A    7/2008
(Continued)

OTHER PUBLICATIONS

Japanese-language Office Action issued in Japanese Application No. 2020-119997 dated Jan. 9, 2024 with English translation (5 pages).

*Primary Examiner* — Abdullah A Riyami
*Assistant Examiner* — Nelson R. Burgos-Guntin
(74) *Attorney, Agent, or Firm* — Crowell & Moring LLP

(57) ABSTRACT

A wiring substrate is connected to a backplane, and includes: a first connector that is mounted on one surface of the wiring substrate and is connected to the backplane; an opening portion that is formed in the one surface on a side opposite to a side connected to the backplane of the first connector, and through which a cable having one end connected to the first connector is passed; an integrated circuit that is mounted on the one surface on a side opposite to a side on which the first connector is present relative to the opening portion; and a second connector that is mounted on the other surface on a side opposite to the one surface in the vicinity of the integrated circuit on the side opposite to the side on which the first connector is present relative to the opening portion, is connected to the integrated circuit via a through hole penetrating the wiring substrate, and is connected to the other end of the cable.

12 Claims, 16 Drawing Sheets

(51) Int. Cl.
   *H01R 12/65*     (2011.01)
   *H05K 1/02*      (2006.01)
   *H05K 1/14*      (2006.01)
   *H05K 3/32*      (2006.01)

(52) U.S. Cl.
   CPC ....... *H05K 3/321* (2013.01); *H05K 2201/048* (2013.01)

(58) Field of Classification Search
   CPC ........... H05K 2201/048; H05K 7/1445; H05K 7/20727; H05K 1/0203; H05K 2201/044; H05K 2201/09063; H05K 2201/10083; H05K 2201/10159; H05K 2201/10189; H05K 1/14; G06F 1/189; G06F 1/20
   See application file for complete search history.

(56) References Cited

U.S. PATENT DOCUMENTS

| | | | |
|---|---|---|---|
| 2018/0006416 A1* | 1/2018 | Lloyd | H05K 7/1487 |
| 2019/0297722 A1* | 9/2019 | Baba | H05K 3/46 |
| 2019/0387626 A1* | 12/2019 | Baba | H05K 1/14 |

FOREIGN PATENT DOCUMENTS

| | | | |
|---|---|---|---|
| JP | 2015-121565 A | 7/2015 |
| JP | 2019-57497 A | 4/2019 |
| JP | 2019-535122 A | 12/2019 |

\* cited by examiner

[FIG. 1]
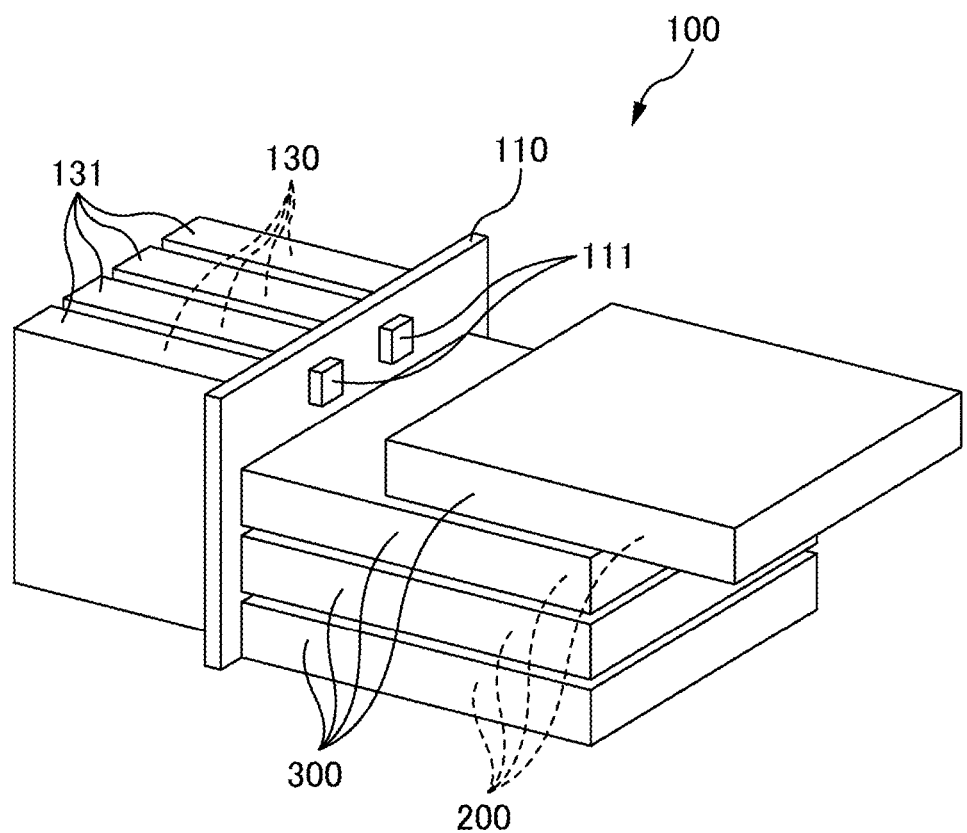

[FIG. 2]
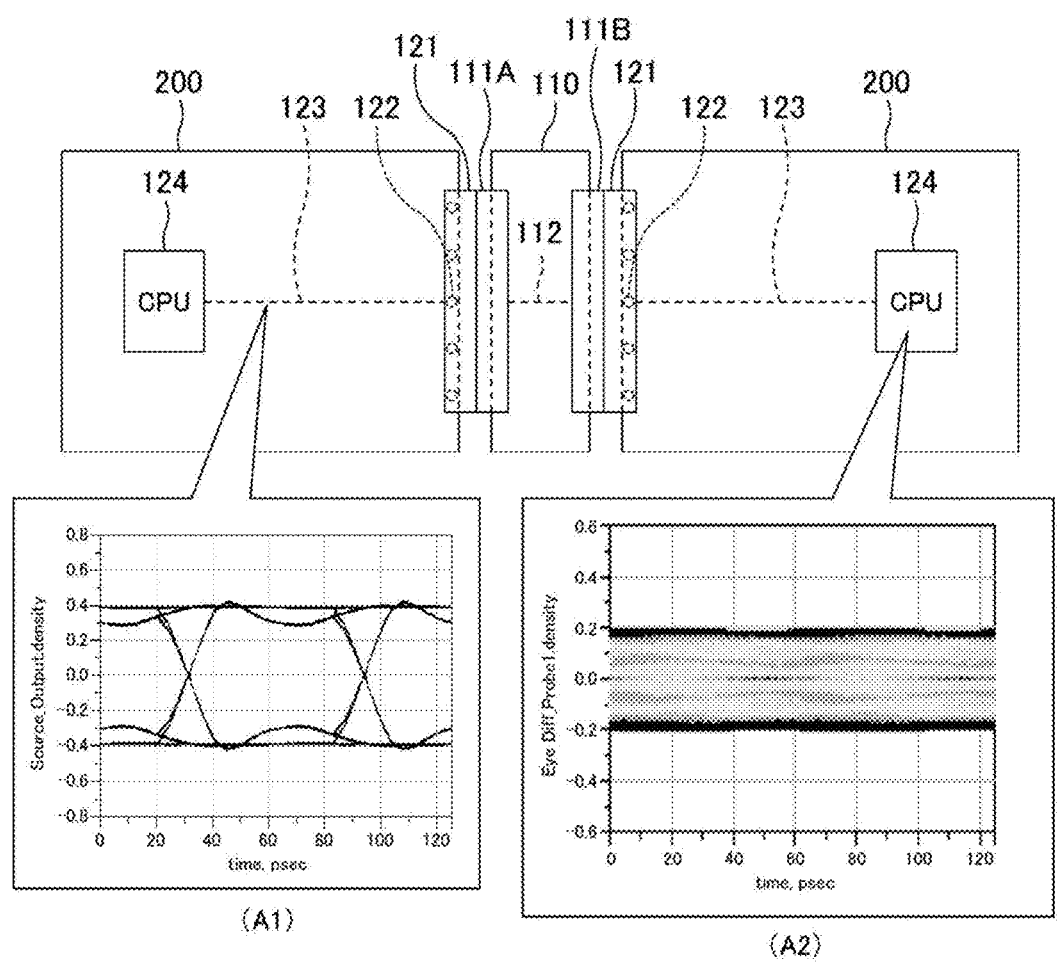

[FIG. 3]
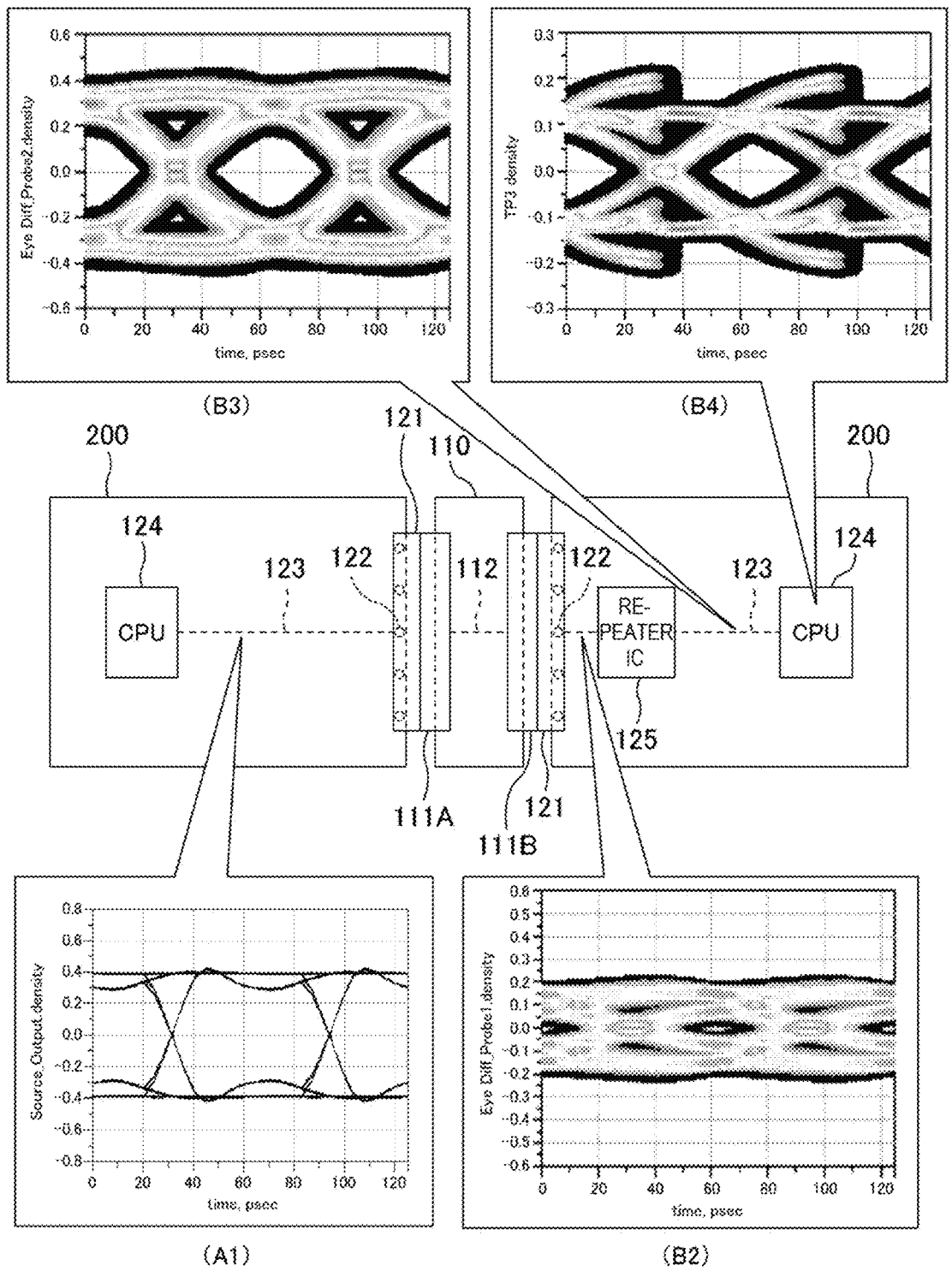

[FIG. 4]
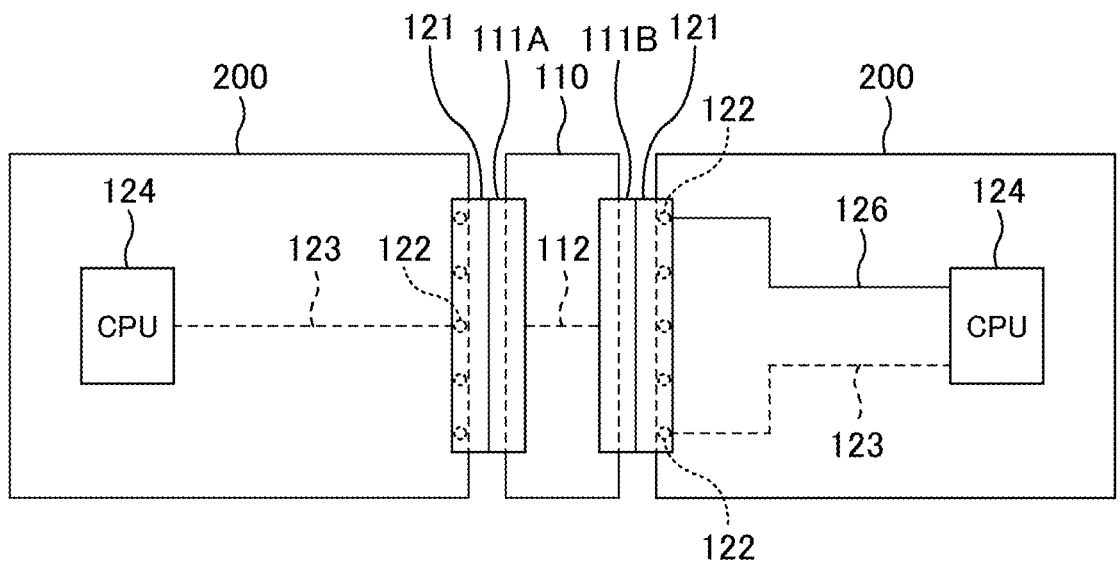
[FIG. 5A]
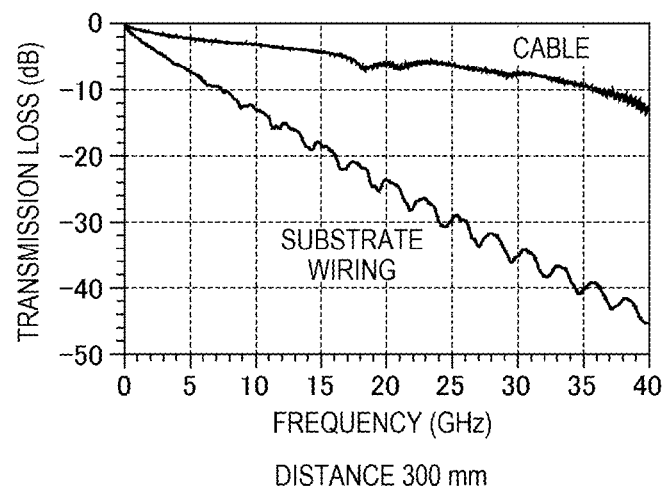
DISTANCE 300 mm

[FIG. 5B]
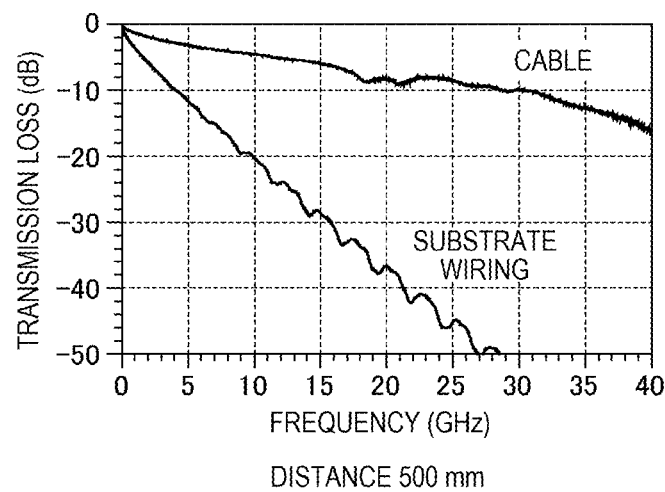
DISTANCE 500 mm
[FIG. 5C]
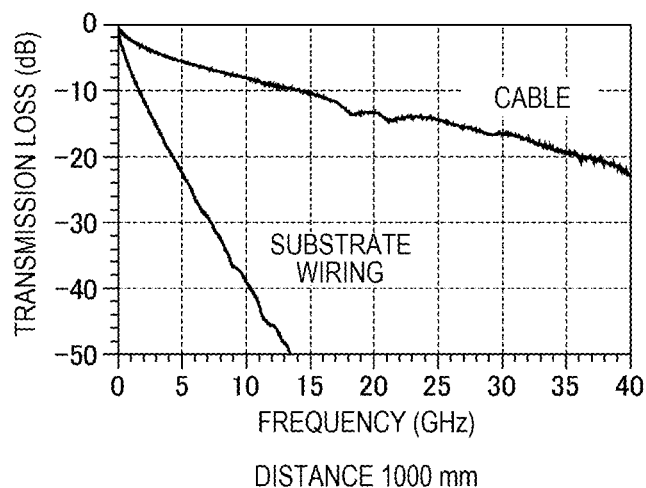
DISTANCE 1000 mm

[FIG. 6]
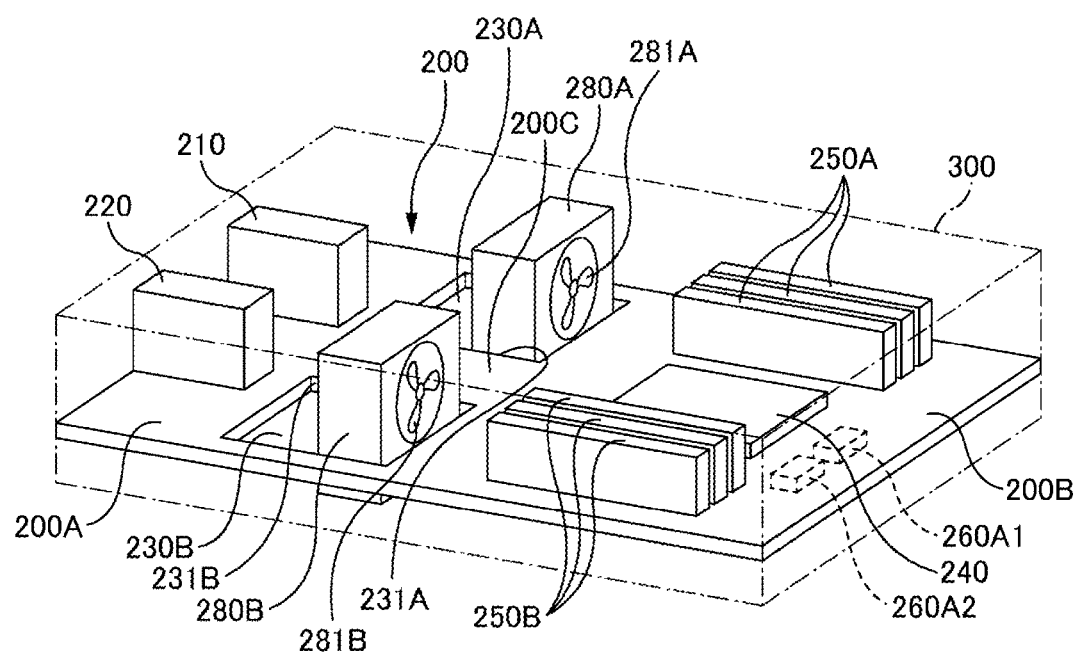

[FIG. 7]
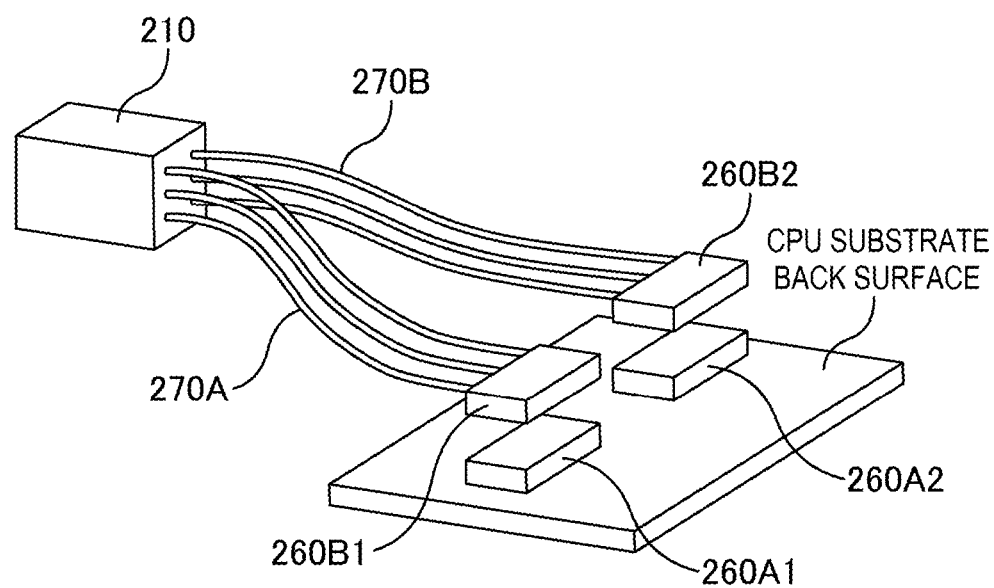

[FIG. 8A]
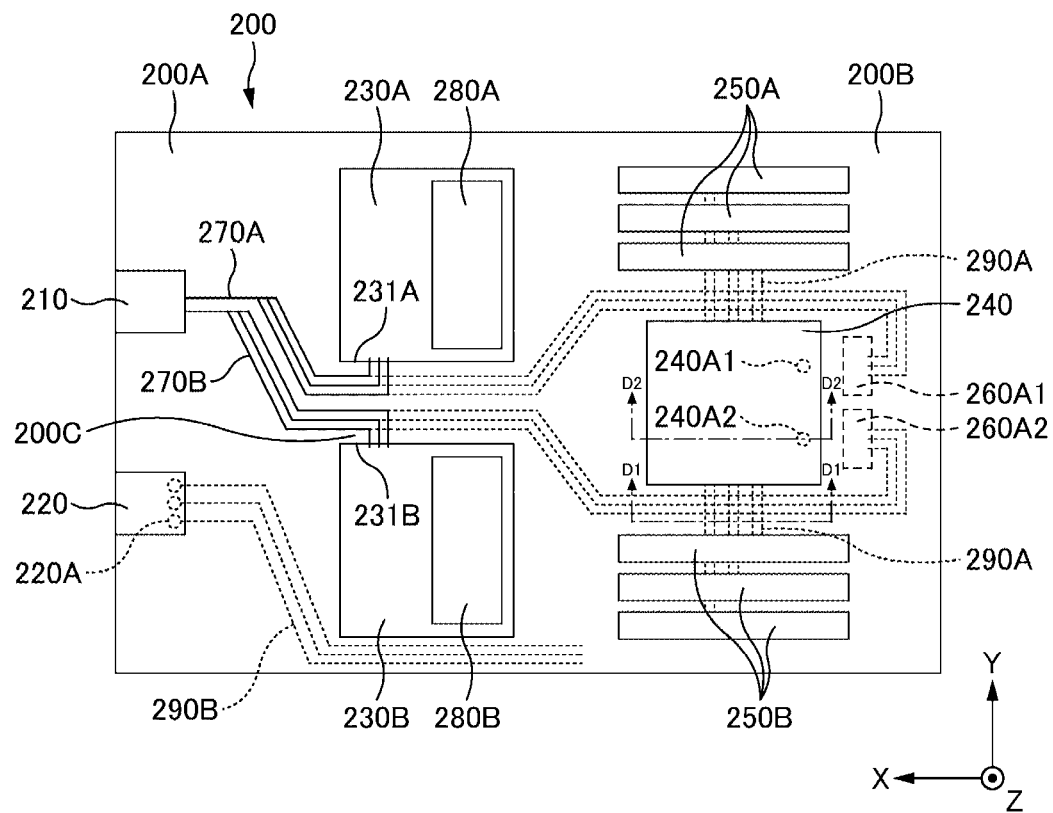
[FIG. 8B]
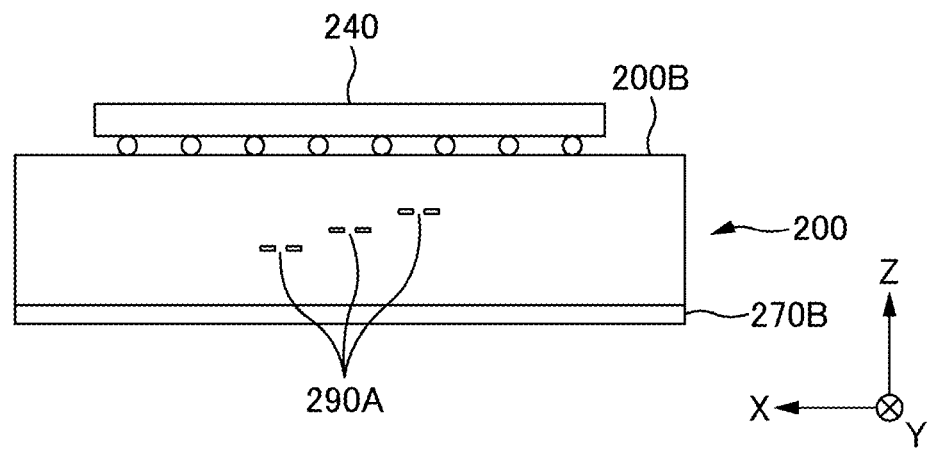

[FIG. 9A]
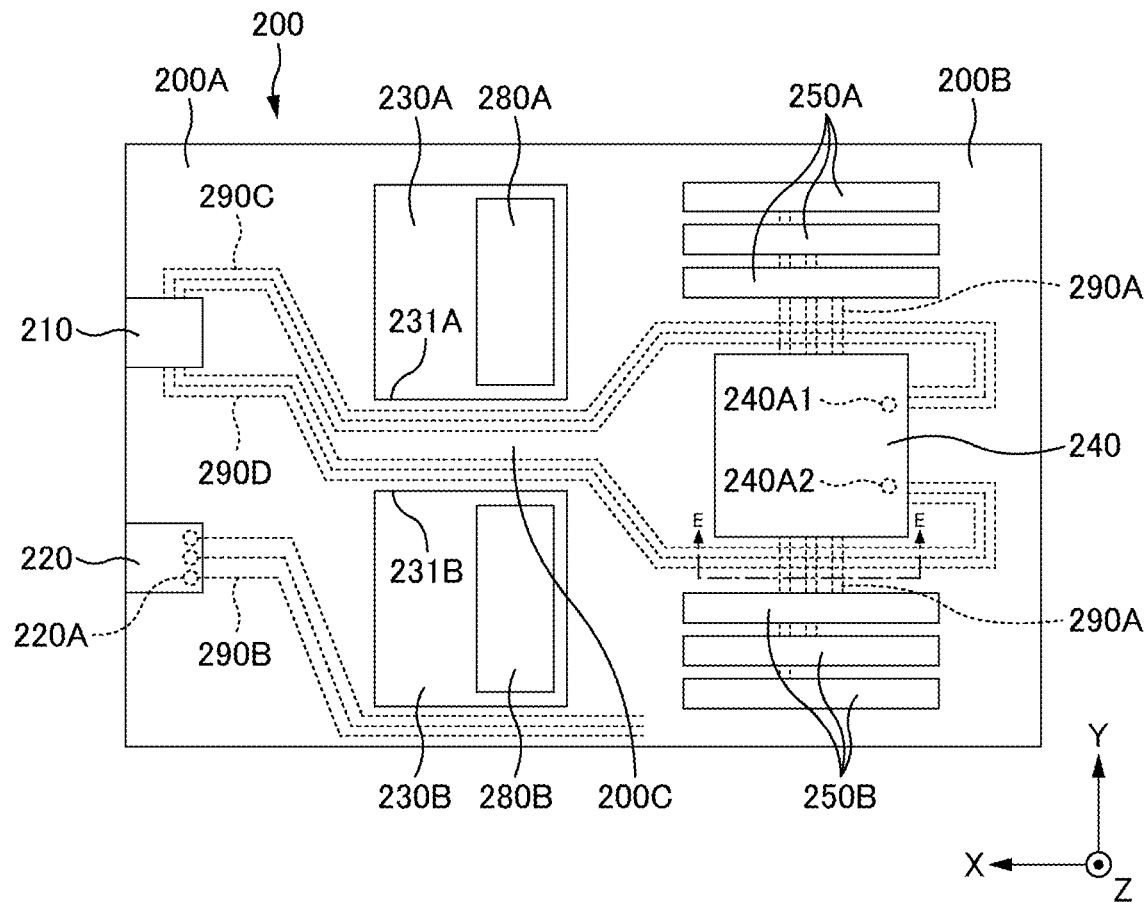
[FIG. 9B]
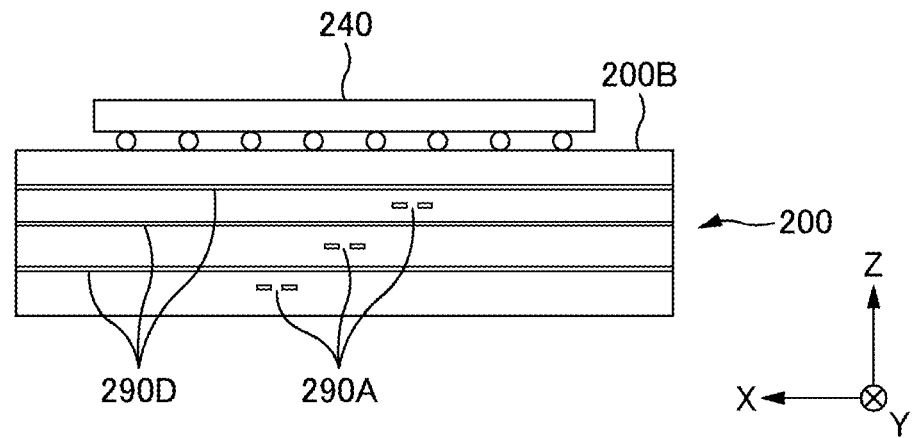

[FIG. 10]
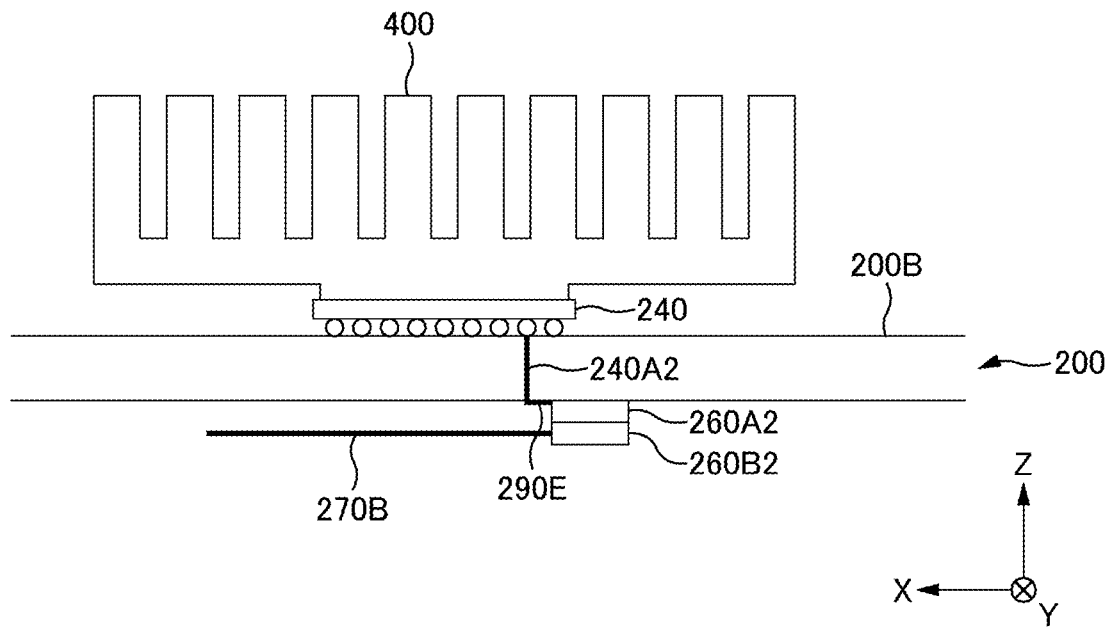
[FIG. 11]
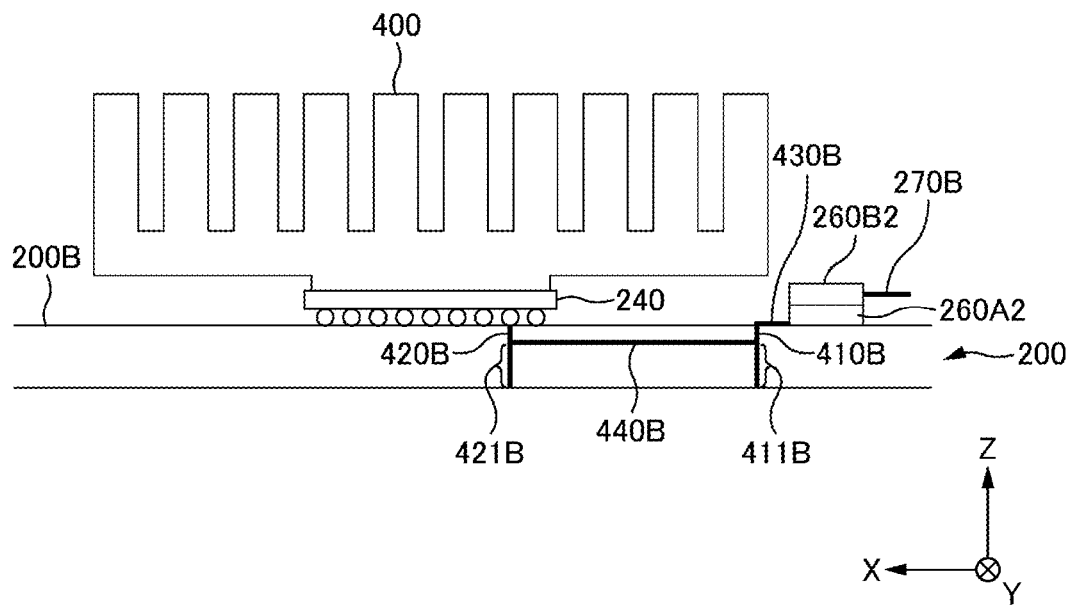

[FIG. 12A]
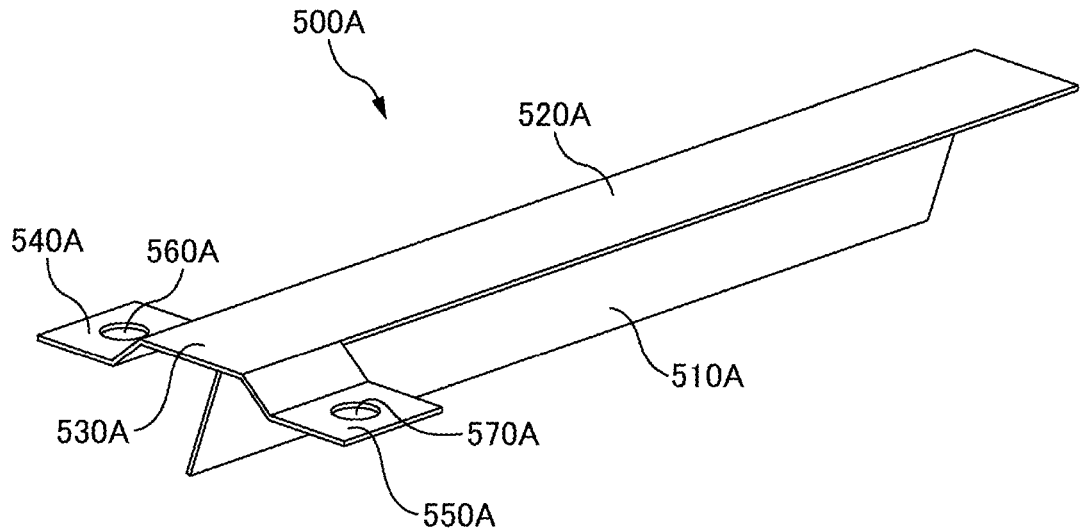
[FIG. 12B]
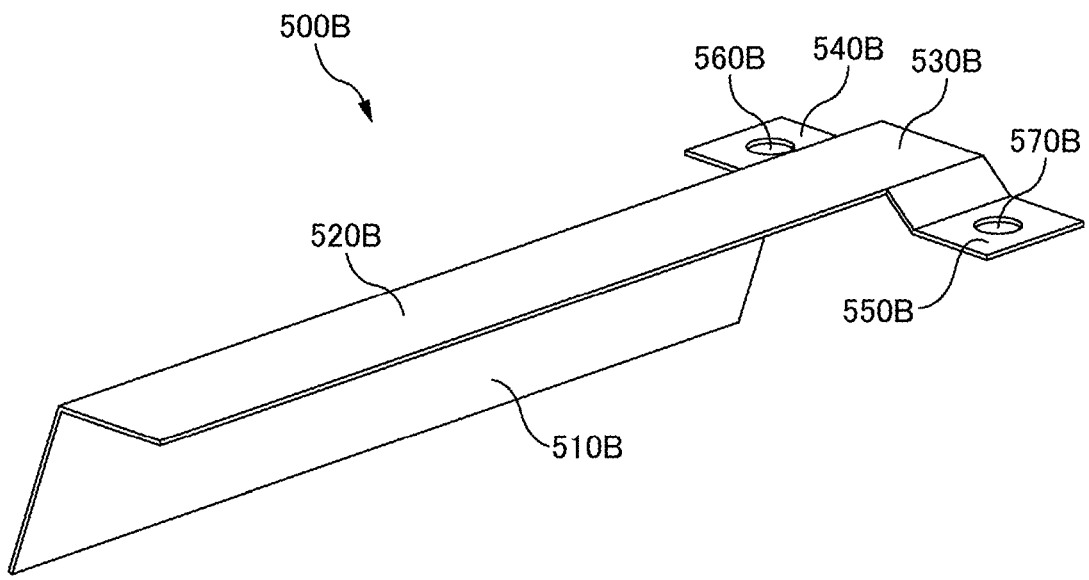

[FIG. 13A]
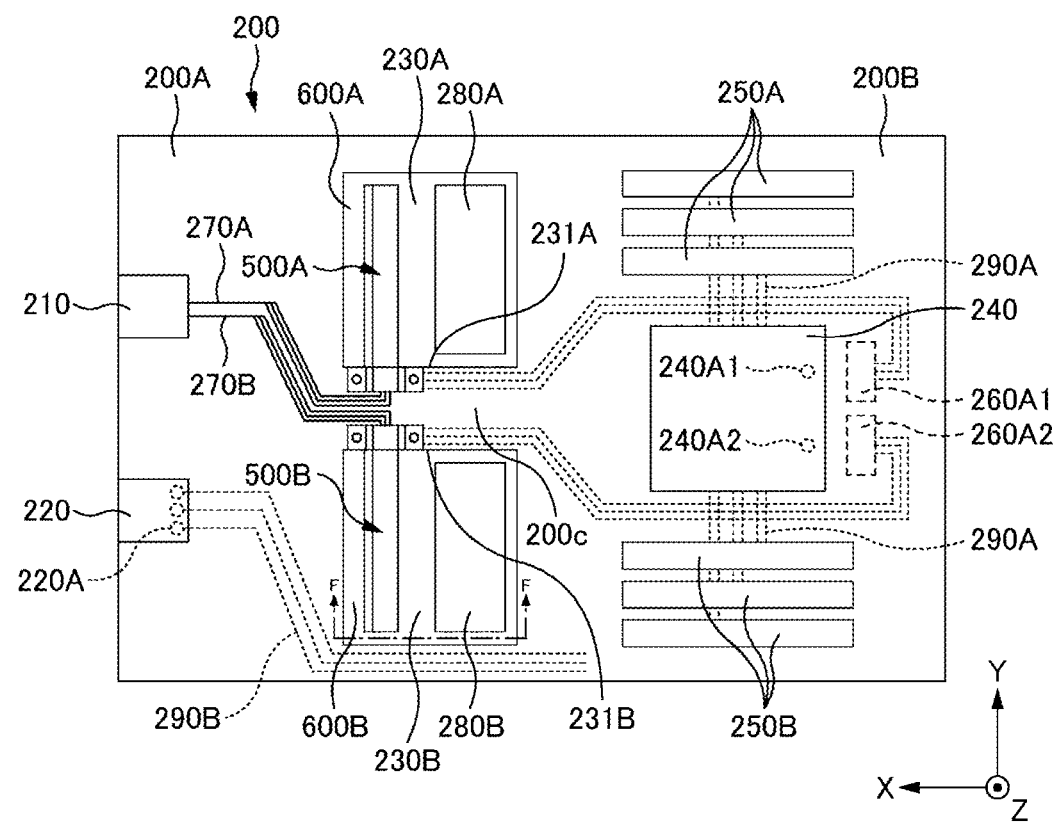

[FIG. 13B]
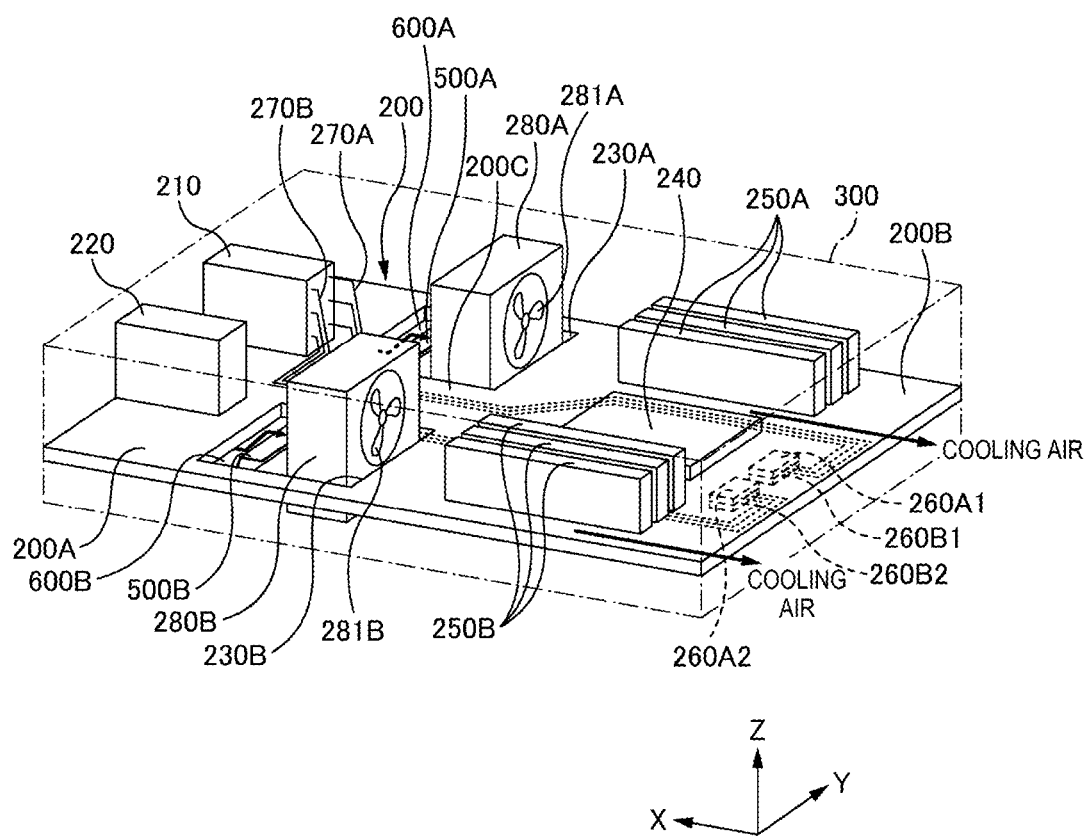

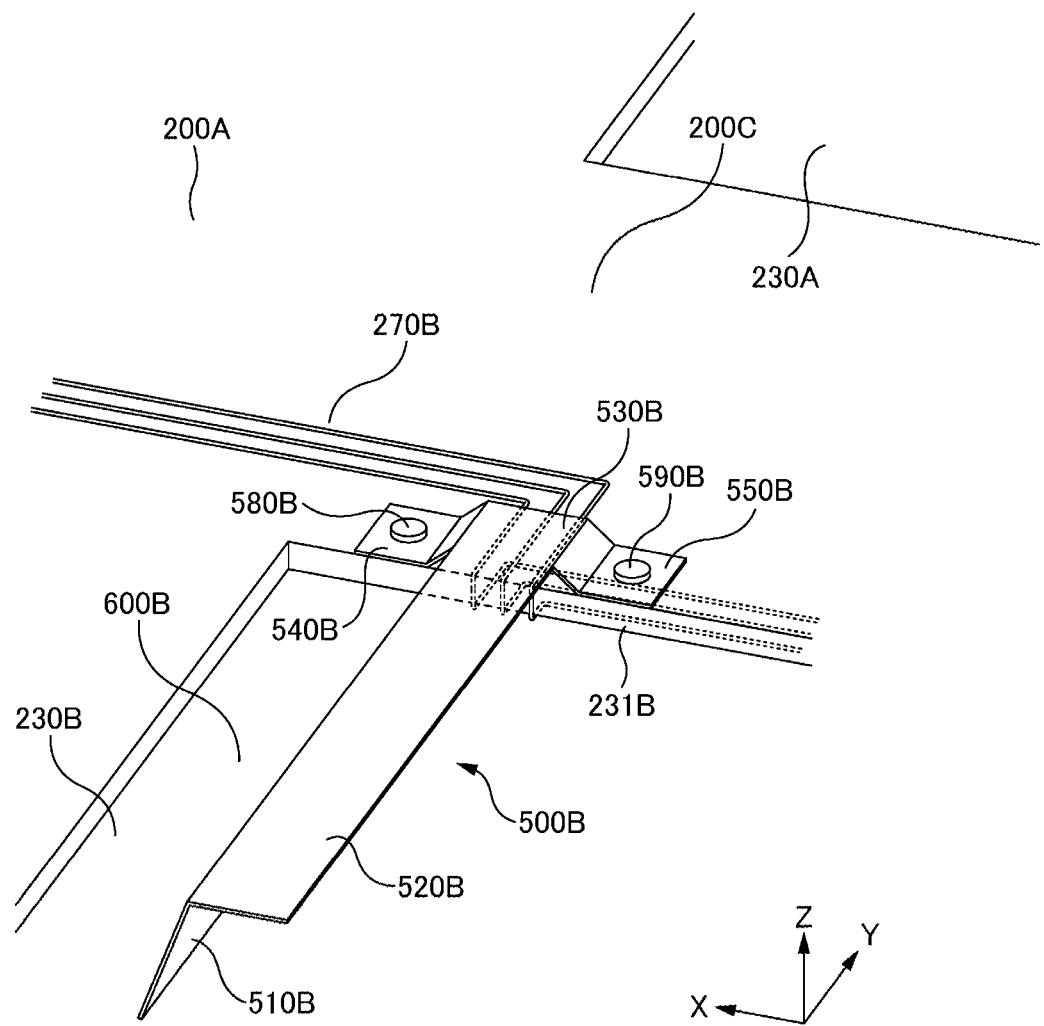

[FIG. 15]
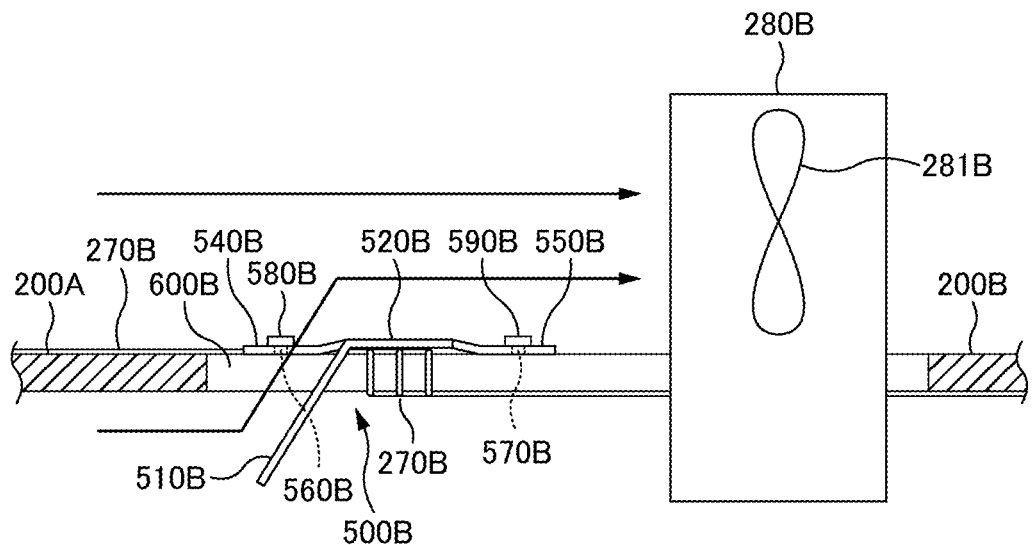
[FIG. 16]
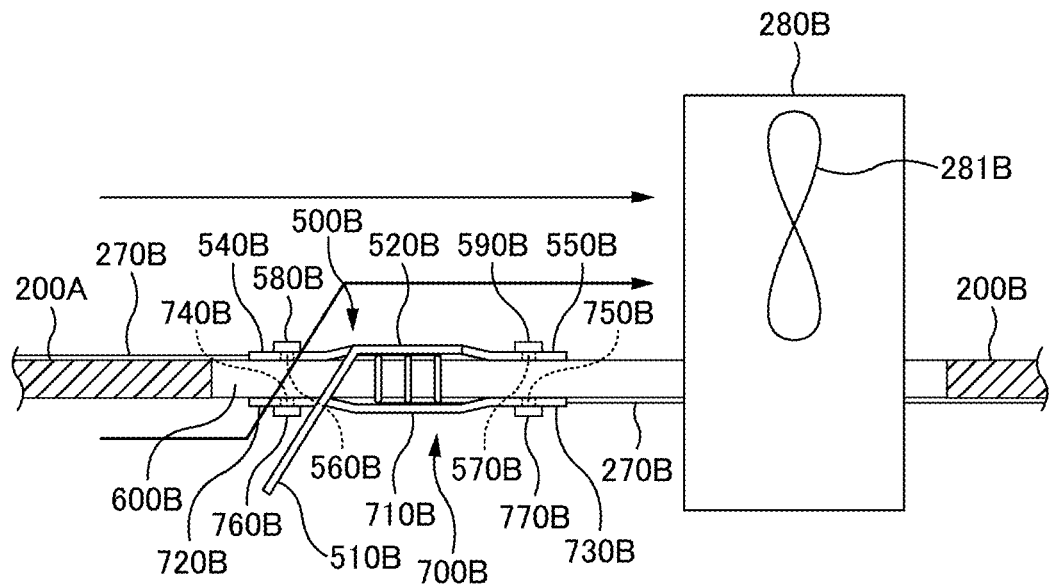

[FIG. 17]
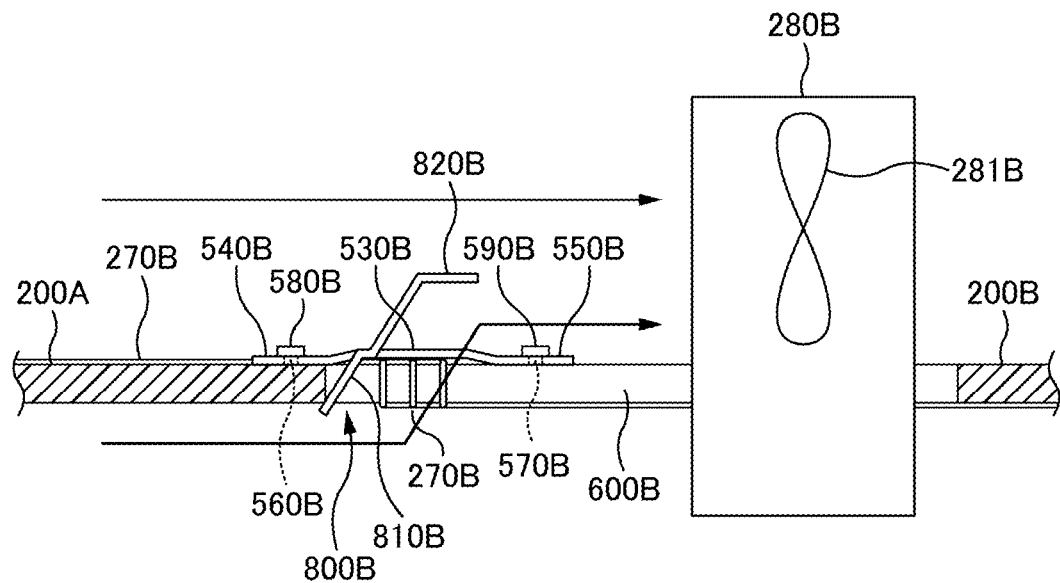
[FIG. 18]
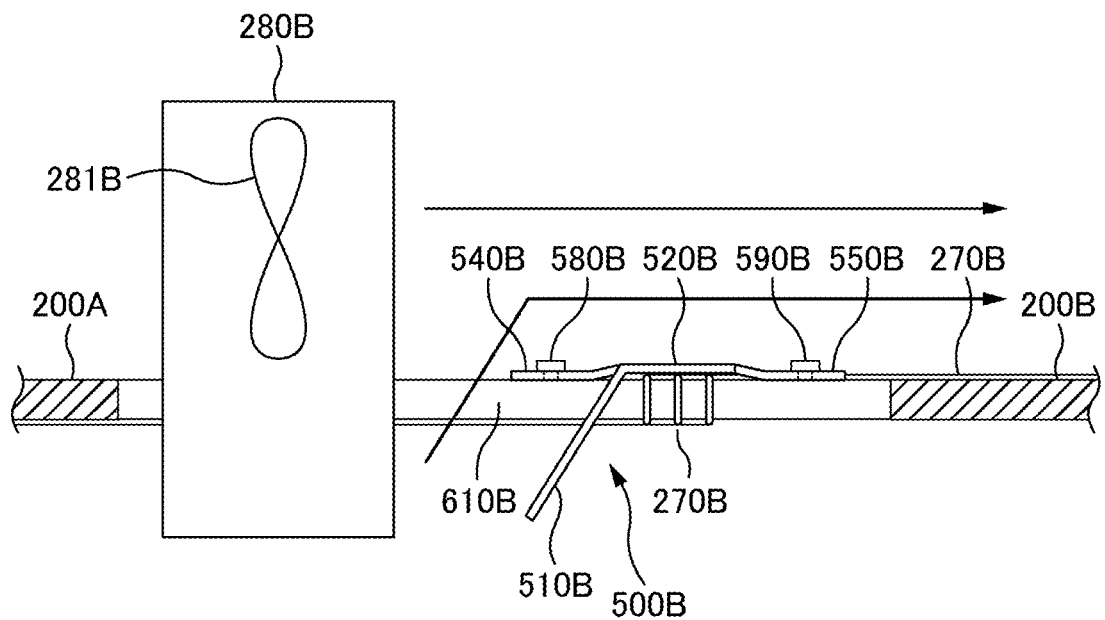

WIRING SUBSTRATE AND INFORMATION PROCESSING DEVICE

CROSS-REFERENCE TO RELATED APPLICATION

This application claims priority pursuant to Japanese patent application No. 2020-119997, filed on Jul. 13, 2020, the entire disclosure of which is incorporated herein by reference.

BACKGROUND

Technical Field

The present invention relates to a wiring substrate and an information processing device.

Related Art

Japanese Patent Application Laid-open Publication No. 2006-179821 (Reference 1) describes a printed circuit substrate. The printed circuit substrate is formed by connecting a plurality of mounted components at multiple points by anisotropic conductive film adhesion using a flexible substrate. On the flexible substrate, a transmission path of a wiring pattern whose transmission characteristic is optimized for each signal is formed.

Japanese Patent Application Laid-open Publication No. 2019-57497 (Reference 2) describes a circuit substrate bypass assembly and components thereof. The circuit substrate bypass assembly provides a connector used in a self-standing connector port for fitting to an external pluggable module. The connector includes a terminal that extends in a length direction of the connector and terminates the cable, and the terminal and the cable are generally aligned horizontally. The connector includes a housing and two connection elements adjacent to a card receiving slot of the connector. The cable extends to a rear of a connector element and to an outside from the connector port. The connector element engages with the connector port and fixes the connector to an appropriate position in the connector port.

Japanese Patent Application Laid-open Publication No. 2015-121565 (Reference 3) describes a multi-channel optical module and an information processing device using the same. The multi-channel optical module includes a substrate having a wiring pattern formed on a surface of the substrate, a semi-conductor device mounted on the wiring pattern of the substrate, a heat radiation fin that is mounted on the semi-conductor device and is configured to radiate heat generated in the semi-conductor device, a photoelectric conversion element that is mounted on the wiring pattern of the substrate and is electrically connected to the semi-conductor device, a module connector having one surface connected to the photoelectric conversion element, and an optical fiber or an optical waveguide path connected to the other surface of the module connector. The optical fiber or the optical waveguide path is connected to the module connector in a manner of extending in a direction intersecting a direction in which the semi-conductor device and the photoelectric conversion element are arranged on the substrate.

In Reference 1, the flexible substrate is provided on one surface of the printed circuit substrate. On the flexible substrate, the transmission path of the wiring pattern whose characteristics are optimized for each signal is formed. In Reference 2, the cable connected between the connector and the connector port is provided on one surface of the circuit substrate bypass assembly. In Reference 3, the optical fiber or the optical waveguide path is provided on the surface of the substrate on a side on which the semi-conductor device and the photoelectric conversion element are mounted.

However, in the configurations disclosed in References 1 to 3, an increase in transmission loss of a substrate wiring due to the increase in a processing frequency of a signal and quality deterioration of the signal waveform due to a cross-talk may not be effectively prevented.

SUMMARY

The invention has been made in view of the background described above, and an object of the invention is to provide a wiring substrate and an information processing device that are capable of effectively preventing signal transmission loss and quality deterioration.

In order to achieve the above object, one aspect of the invention provides a wiring substrate that is connected to a backplane and includes: a first connector that is mounted on one surface of the wiring substrate and is connected to the backplane; an opening portion that is formed in the one surface on a side opposite to a side connected to the backplane of the first connector, and through which a cable having one end connected to the first connector is passed; an integrated circuit that is mounted on the one surface on a side opposite to a side on which the first connector is present relative to the opening portion; and a second connector that is mounted on the other surface on a side opposite to the one surface in the vicinity of the integrated circuit on the side opposite to the side on which the first connector is present relative to the opening portion, is connected to the integrated circuit via a through hole penetrating the wiring substrate, and is connected to the other end of the cable.

Other problems disclosed by the present application and methods for solving such problems will become apparent from description of embodiments and drawings.

According to the invention, signal transmission loss and quality degradation can be effectively prevented.

BRIEF DESCRIPTION OF DRAWINGS

FIG. 1 is a schematic perspective view showing a state in which a wiring substrate is connected to a backplane;

FIG. 2 is a diagram showing a connection example between the backplane and the wiring substrate;

FIG. 3 is a diagram showing another connection example between the backplane and the wiring substrate;

FIG. 4 is a diagram showing another connection example between the backplane and the wiring substrate;

FIG. 5A is a characteristic diagram showing a relationship between a frequency of a signal and a transmission loss in a substrate wiring and a cable;

FIG. 5B is a characteristic diagram showing a relationship between the frequency of the signal and the transmission loss in the substrate wiring and the cable;

FIG. 5C is a characteristic diagram showing a relationship between the frequency of the signal and the transmission loss in the substrate wiring and the cable;

FIG. 6 is a perspective view showing a configuration of a part of the wiring substrate;

FIG. 7 is a perspective view showing a configuration of another part of the wiring substrate;

FIG. 8A is a plan view showing the wiring substrate as viewed from a front surface side toward a back surface side;

FIG. 8B is a cross-sectional view showing a surface of the wiring substrate in FIG. 8A taken along a line D-D;

FIG. 9A is a plan view showing a comparative example of the wiring substrate in FIG. 8A;

FIG. 9B is a cross-sectional view of a surface of the wiring substrate in FIG. 8A taken along a line E-E;

FIG. 10 is another cross-sectional view showing the surface of the wiring substrate in FIG. 8A taken along the line D-D;

FIG. 11 is a cross-sectional view showing a comparative example of the wiring substrate in FIG. 10;

FIG. 12A is a perspective view showing an air guiding plate used in the wiring substrate;

FIG. 12B is a perspective view showing an air guiding plate used in the wiring substrate;

FIG. 13A is a plan view showing the wiring substrate in FIG. 8A, on which the air guiding plate is mounted, as viewed from the front surface side toward the back surface side;

FIG. 13B is an overall perspective view showing a state in which the air guiding plate is mounted on the wiring substrate in FIG. 8A;

FIG. 14 is a perspective view showing a main portion showing a state in which the air guiding plate is mounted on the wiring substrate;

FIG. 15 is a cross-sectional view showing a surface of the wiring substrate in FIG. 13 taken along a line F-F;

FIG. 16 is a cross-sectional view showing a state in which a fixing plate is mounted on the back surface of the wiring substrate in FIG. 15;

FIG. 17 is a cross-sectional view showing an air guiding plate according to a modified example; and FIG. 18 is a cross-sectional view showing an air guiding plate according to another configuration example.

DESCRIPTION OF EMBODIMENTS

Hereinafter, an embodiment will be described with reference to the drawings. In the following description, the same or similar components are denoted by the same reference numerals, and a repetitive description thereof may be omitted. Similar components may be distinguished from each other by adding suffixes such as alphabets to common reference numerals. The terms "first", "second", "third", and the like in the present specification are used to identify components, and do not necessarily limit numbers, orders, or contents thereof.

FIG. 1 is a diagram showing a relationship between wiring substrates (CPU substrates 200 and expansion substrates 130) and a backplane 110 that constitute an information processing device 100 described according to an embodiment. The information processing device 100 constitutes, for example, a server or a storage device that are provided in a data center, a system center, or the like. The backplane 110 and the wiring substrates are provided in, for example, a housing (rack) provided in the data center, the system center, or the like. The backplane 110 is provided in the housing such that a surface thereof is vertical, for example, and the wiring substrates are connected (mounted) to the backplane 110 such that surfaces thereof are horizontal, for example.

On the backplane 110, for example, a power supply line through which driving power is supplied to a bus or the wiring substrates is formed. The bus communicably connects the wiring substrates. Connectors 111 are provided at positions where the wiring substrates on both sides of the backplane 110 are connected. A connector (first connector) is provided at a position of the wiring substrates to be connected to the backplane 110. By connecting the connectors 111 of the backplane 110 and the connector of the wiring substrates, the wiring substrates connected to the backplane 110 are communicably connected to each other.

The CPU substrate 200 is a substrate on which various integrated circuits and electronic components including a processor (a central processing unit (CPU), a micro processing unit (MPU), or the like) and a memory (a random access memory (RAM), a read only memory (ROM), or the like) are mounted. The CPU substrate 200 is accommodated in a substrate box 300 in which air permeability is ensured. The substrate box 300 is made of, for example, a material such as a metal (stainless steel, aluminum, or the like) having excellent thermal conductivity. A connector to be connected to the connector 111 of the backplane 110 is exposed on a side of the substrate box 300 to be connected to the backplane 110.

The expansion substrate 130 is a substrate on which various integrated circuits and electronic components that expand functions of the information processing device 100 are mounted. The expansion substrate 130 is accommodated in a substrate box 131 in which air permeability is ensured. The substrate box 131 is made of, for example, a material such as a metal (stainless steel, aluminum, or the like) having excellent thermal conductivity. A connector to be connected to the connector 111 of the backplane 110 is exposed on a side of the substrate box 131 to be connected to the backplane 110.

FIG. 2 shows a connection example (hereinafter referred to as a "first connection example") between the backplane and the wiring substrate. As shown in the drawing, in the first connection example, two CPU substrates 200 are connected to each other with the backplane 110 interposed therebetween. Each CPU substrate 200 is, for example, a multilayer wiring substrate in which a large number of signal lines, power supply lines, ground lines, and the like that electrically connect an integrated circuit to be mounted, other electronic components, and the like are efficiently wired at a high density. The CPU substrate 200 is formed with a plurality of through holes 122 through which substrate wirings 123 in the layers are electrically connected. A connector 121 of the CPU substrate 200 is connected to the substrate wiring 123 in any layer through the through holes 122.

In order to make the description easy to understand, in FIGS. 2 to 4, one CPU 124 is shown as the integrated circuit mounted on the CPU substrate 200, one substrate wiring 123 connecting the CPU 124 and the connector 121 is shown as the substrate wiring 123 formed in an inner layer of the CPU substrate 200, and one substrate wiring 112 connecting the connectors 111 (111A and 111B) provided on both left and right sides of the drawing of the backplane 110 is shown as the substrate wiring formed in an inner layer of the backplane 110.

In the same figure, the connector 121 of the CPU substrate 200 on the left side of the drawing is connected to the connector 111A of the backplane 110, and the connector 121 of the CPU substrate 200 on the right side of the drawing is connected to the connector 111B of the backplane 110. Accordingly, the two CPUs 124 on both the left and right sides of the drawing are electrically connected to each other via the substrate wirings 112 and 123. One of the CPU substrates 200 on both sides of the drawing may be the expansion substrate 130.

Here, a case in which a signal (data) is transmitted from the CPU 124 on the left side of the drawing to the CPU 124 on the right side of the drawing. As a standard for transmitting a signal between the CPU substrates 200 or between the CPU substrate 200 and the expansion substrate 130, for example, a peripheral component interconnect express (PCIe) is known. A transmission speed of the signal defined by PCIe is, for example, 8 Gb/s in PCIe 3.0, 16 Gb/s in PCIe 4.0, and 32 Gb/s in PCIe 5.0. As a matter of course, the signal processing speed is improved by adopting PCIe which is a higher transmission speed standard for the information processing device 100. However, since the processing frequency of the signal increases, the transmission loss of the substrate wiring 123 when the signal is transmitted from the CPU 124 on the left side of the drawing to the CPU 124 on the right side of the drawing increases. As the processing frequency of the signal increases, impedance mismatching occurs in the through holes 122, and a signal that is reflected by the substrate wiring 123 and is transmitted through the adjacent substrate wiring 123 is noise. As shown in the characteristic diagrams A1 and A2 (eye patterns) in the lower part of the same figure, a so-called crosstalk by which quality of a signal waveform transmitted through the substrate wiring 123 is deteriorated is likely to occur. Although the transmission loss can be reduced by selecting the material of the substrate wiring 123, it is difficult to reduce an influence of the crosstalk.

FIG. 3 shows another connection example (hereinafter referred to as a "second connection example") between the backplane and the wiring substrate. In the second connection example, a repeater IC 125 such as a re-timer or a re-driver is inserted in the middle of the substrate wiring 123 connecting the connector 121 and the CPU 124 in the CPU substrate 200 on the right side of the drawing in the first connection example. The repeater IC 125 performs a signal re-formation process to improve quality of the signal before being input to the CPU 124 on the right side of the drawing. Characteristic diagrams B2, B3, and B4 shown in the same figure are all signal waveforms (eye patterns) measured for an input signal shown in a characteristic diagram A1, and are, in order, a waveform of the input signal of the repeater IC 125, a waveform of the output signal of the repeater IC 125, and a signal waveform processed by the CPU 124. As shown in the characteristic diagrams A1 and B2 to B4, the quality of the signal waveform is improved by the repeater IC 125. However, when the repeater IC 125 is used, a power consumption of the CPU substrate 200 increases. Since a space is secured for mounting the repeater IC 125, the CPU substrate 200 is increased in size.

FIG. 4 shows another connection example (hereinafter referred to as a "third connection example") between the backplane and the wiring substrate. In the third connection example, instead of the substrate wiring 123 connecting the connector 121 and the CPU 124 in the CPU substrate 200 on the right side of the drawing in the first connection example, a cable 126 having a signal transmission loss lower than that of the substrate wiring 123 is connected between the connector 121 and the CPU 124 on the CPU substrate 200.

FIGS. 5A to 5C are characteristic diagrams comparing the relationship between the frequency of the signal and the transmission loss in the case in which the substrate wiring 123 and the cable 126 are at the same distance. In FIGS. 5A to 5C, the horizontal axis represents the processing frequency of the signal, and the vertical axis represents the transmission loss of the substrate wiring 123 and the cable 126. FIGS. 5A to 5C show cases in which a distance between the substrate wiring 123 and the cable 126 connected between the connector 121 and the CPU 124 is, for example, 300 mm, 500 mm, and 1000 mm, respectively. In all of the FIGS. 5A to 5C, although the transmission loss of the substrate wiring 123 and the cable 126 increases as the processing frequency of the signal increases, the transmission loss of the cable 126 is smaller than the transmission loss of the substrate wiring 123. Although when the distance between the substrate wiring 123 and the cable 126 is increased, the transmission loss of the substrate wiring 123 and the cable 126 is increased, in this case, the transmission loss of the cable 126 is smaller than the transmission loss of the substrate wiring 123. In this way, by using the cable 126 instead of the substrate wiring 123, the transmission loss of the signal from the connector 121 to the CPU 124 can be reduced as compared with the case of using the substrate wiring 123.

However, the connector 121 is connected to the cable 126 on the CPU substrate 200 instead of the through hole 122. Therefore, it is necessary to secure a space for mounting the connector 121 and the cable 126 on the CPU substrate 200, and the CPU substrate 200 is increased in size. On the CPU substrate 200, the CPU 124 and other ICs are mounted as an integrated circuit, and on the integrated circuit, for example, a relatively large cooling member (a heat radiation fin, a cooling fan, a cooling element (a Peltier element or the like), or the like) for heat dissipation is provided. Therefore, the connector 121 cannot be disposed in the vicinity of the above-described integrated circuit. As a result, the length of the cable 126 is increased, and it is possible that the transmission loss cannot be reduced to be sufficiently small.

FIG. 6 is a perspective view showing the CPU substrate 200 for solving the above problem. In the same drawing, a front surface (one surface) of the CPU substrate 200 is shown on an upper side of the drawing. In the description for FIG. 6, coordinate axes (an X axis, a Y axis, and a Z axis) may be used. FIG. 7 is a perspective view showing a configuration of another part of the CPU substrate 200. In the same figure, a back surface of the wiring substrate is shown on the upper side of the drawing so that a connection of connectors 260A and 260B (second connectors) to be described later can be easily understood. FIG. 8A is a plan view of the CPU substrate 200 in FIG. 6 as viewed from a front surface side toward a back surface side. FIG. 8B is a cross-sectional view of a surface of the CPU substrate 200 in FIG. 8A taken along a line D1-D1, as viewed toward a +Y side.

The CPU substrate 200 illustrated in the figures is, for example, a rectangular multilayer wiring substrate in which substrate wirings 290 (a large number of signal lines, power supply lines, ground lines, and the like) are formed in a predetermined layer, and includes a cable backplane connector 210 (first connector), a substrate wiring backplane connector 220 (first connector), opening portions 230A and 230B, a CPU 240 and memories 250A and 250B which are integrated circuits, connectors 260A1, 260A2, 260B1, and 260B2, cables 270A and 270B, and cooling fans 280A and 280B. Heat radiation fins 400 that promote heat radiation of the CPU 240 is thermally coupled to an outer surface (upper surface) of the CPU 240. Hereinafter, a longitudinal direction of the CPU substrate 200 is defined as a direction along the X axis, a transverse direction of the CPU substrate 200 is defined as a direction along the Y axis, and a thickness direction of the CPU substrate 200 is defined as a direction along the Z axis.

The CPU 240 is provided as a package (a pin grid array (PGA), a land grid array (LGA), a ball grid array (BGA), or the like), for example. The CPU 240 may be attached to a socket provided on the front surface of the CPU substrate 200, or may be directly attached to the CPU substrate 200.

The CPU 240 has, for example, a flat and substantially rectangular shape, and is mounted on the socket provided on the front surface of the CPU substrate 200 such that a plane of the CPU 240 is substantially parallel to the surface of the CPU substrate 200.

The memories 250A and 250B are provided as, for example, memory modules (a single in-line memory module (SIMM), a dual inline memory module (DIMM), and the like). The memories 250A and 250B may be attached to one or more sockets (memory slots) provided on the front surface of the CPU substrate 200, or may be directly attached to the CPU substrate 200. The memories 250A and 250B have, for example, a flat and substantially rectangular shape, and are mounted on the socket provided on the front surface of the CPU substrate 200 such that a plane of the memories 250A and 250B is vertical to the surface of the CPU substrate 200.

The connectors 260A1, 260A2, 260B1, and 260B2 are provided on end portions of the cables 270A and 270B or on the surface of the CPU substrate 200, and each of the connectors 260A1, 260A2, 260B1, and 260B2 includes a housing having a substantially rectangular parallelepiped shape. In the housing, electrical contacts (coupling pins) of the number corresponding to the number of signal lines and power supply lines are accommodated.

As shown in FIGS. 6 and 8A, the opening portions 230A and 230B have a rectangular shape or a substantially rectangular shape, and are formed side by side in the transverse direction of the CPU substrate 200 near a center of the CPU substrate 200 in a longitudinal direction in a manner of separating a mounting area 200A of the cable backplane connector 210 and the substrate wiring backplane connector 220 from a mounting area 200B of the CPU 240 and the memories 250A and 250B in the CPU substrate 200. In the example, two opening portions 230A and 230B are formed in the CPU substrate 200. The opening portions 230A and 230B have a role of positioning the cooling fans 280A and 280B at predetermined positions with respect to the CPU substrate 200, respectively. An inner side surface 231A of the opening portion 230A on a side (−Y side) close to the opening portion 230B and an inner side surface 231B of the opening portion 230B on a side (+Y side) close to the opening portion 230A are used as surfaces along which the cables 270A and 270B extend in a manner of not interfering with a flow of cooling air sent out from the cooling fans 280A and 280B, respectively. The opening portions 230A and 230B are not limited to a rectangular shape or a substantially rectangular shape, and may have at least an area 200C (an area having the inner side surfaces 231A and 231B at both ends) sandwiched between the opening portions 230A and 230B. The opening portions 230A and 230B may have shapes corresponding to the shapes of the cooling fans 280A and 280B and the number and arrangement positions of components to be mounted.

A front surface (surface on a +Z side) of the CPU substrate 200 is a mounting surface for components such as the cable backplane connector 210, the substrate wiring backplane connector 220, the CPU 240, and the memories 250A and 250B. The back surface (the surface on the −Z side) of the CPU substrate 200 is a solder surface and is also a mounting surface for components such as the connector 260A.

The CPU 240 and the memories 250A and 250B are mounted in a mounting area 200B on the right side (−X side) of the drawing relative to the opening portions 230A and 230B of the CPU substrate 200. The memories 250A and 250B are mounted on both sides (+Y side and −Y side) of the CPU 240 with the CPU 240 interposed therebetween, for example. The CPU 240 and the memories 250A and 250B are electrically connected to each other by, for example, a substrate wiring 290A formed in the inner layer of the CPU substrate 200 along the transverse direction.

The substrate wiring backplane connector 220 is mounted on the mounting area 200A on the left side (+X direction) of the drawing relative to the opening portion 230B of the CPU substrate 200. As shown in FIG. 8A, one or more through holes 220A are formed in an area of the mounting area 200A in which the substrate wiring backplane connector 220 is mounted. The substrate wiring backplane connector 220 is connected to a substrate wiring 290B formed in the inner layer of the CPU substrate 200 through the through hole 220A, and is electrically connected to, for example, the mounted components other than the CPU 240 and the memories 250A and 250B that are mounted in the mounting area 200B. In the substrate wiring 290B connected to the substrate wiring backplane connector 220, a signal that has a small transmission loss and is not affected by a crosstalk caused by the through hole 220A is transmitted. The substrate wiring backplane connector 220 is connected to, for example, the connector 111 of the backplane 110 as shown in FIG. 1. One of the connectors 111 of the substrate wiring backplane connector 220 and the backplane 110 has a male connector shape, and the other has a female connector shape for being electrically connected to the male connector. The cable backplane connector 210 is mounted on the mounting area 200A on the left side (+X direction) of the drawing relative to the opening portion 230A on the front surface of the CPU substrate 200.

As shown in FIG. 7, one end of each of the cables 270A and 270B having a smaller transmission loss than the substrate wirings 290A and 290B is connected to the cable backplane connector 210. In the same figure, although the cables 270A and 270B are each shown as a set of three cables, the number of the cables 270 per set may be other than three. Although two sets of the cables 270A and 270B are shown in the same figure, the cables having the number of sets other than two may be used.

The cables 270A and 270B are differential transmission cables. In the cables 270A and 270B, for example, two signal lines are provided and are adjacent to each other in a state of being insulated from each other, and further, the two adjacent signal lines are covered with an insulating material. Currents having opposite phases pass through the differential transmission cable to the two signal lines, and the differential transmission cable transmits a signal by a potential difference between the two signal lines at this time. By using the differential transmission cable, the external noise is cancelled, and an electromagnetic interference (EMI) noise is reduced by a canceling effect of a magnetic flux generated in the two signal lines.

As shown in FIG. 8A, on the back surface of the CPU substrate 200, in the vicinity of the position where the CPU 240 is mounted in the mounting area 200B, the connectors 260A1 and 260A2 are mounted side by side in the transverse direction of the CPU substrate 200. Through holes 240A1 and 240A2 are formed in the vicinity of the mounting positions of the connectors 260A1 and 260A2 in the CPU substrate 200, respectively. The connectors 260A1 and 260A2 are electrically connected to the mounting surface (the surface on the −Z side) of the CPU 240 via the through holes 240A1 and 240A2, respectively.

As shown in FIG. 7, the connectors 260B1 and 260B2 are coupled and electrically connected to the connectors 260A1 and 260A2, respectively. One of the connectors 260A1 and 260A2 and the connectors 260B1 and 260B2 has a male connector shape, and the other has a female connector shape.

The connectors 260B1 and 260B2 are connected to the other ends of the cables 270A and 270B, respectively. When the connectors 260A1 and 260A2 are respectively connected to the connectors 260B1 and 260B2, parts from the cable backplane connector 210 of the cables 270A and 270B to the opening portions 230A and 230B are disposed on the front surface side of the CPU substrate 200, and parts from the opening portions 230A and 230B of the cables 270A and 270B to the connectors 260A1, 260A2, 260B1, and 260B2 are disposed on the back surface side of the CPU substrate 200.

The cooling fans 280A and 280B shown in FIGS. 6 and 8A send cooling air for cooling the CPU 240 and the memories 250A and 250B. The cooling fans 280A and 280B are referred to as, for example, a case fan, a PC fan, or the like, and a driving component such as a brush motor, a brushless motor, or the like is mounted. For example, the revolution speed of the fan is controlled by performing voltage control or PWM control on the driving component. In the example, the cooling fans 280A and 280B have a predetermined size (for example, 800 mm angle, 1000 mm angle, 1200 mm angle, or the like) having a flat rectangular shape. The cooling fans 280A and 280B are provided to prevent temperatures of various components (the CPU 240, the memories 250A and 250B, and the like) mounted on the CPU substrate 200 such as the CPU 240 from exceeding a normal range. The cooling fans 280A and 280B are positioned (inside the opening portions 230A and 230B) in a manner of penetrating the opening portions 230A and 230B, respectively. More specifically, the cooling fans 280A and 280B are provided, for example, at positions close to the mounting area 200B (−X side) of the opening portions 230A and 230B such that blade portions 281A and 281B are exposed to the front surface side of the CPU substrate 200. The directions of the air blowing axes of the cooling fans 280A and 280B are set such that the air is efficiently blown to the CPU 240 and the memories 250A and 250B.

As shown in FIG. 6, the CPU substrate 200 is accommodated in the substrate box 300. The substrate box 300 is, for example, a box body surrounded by a wall having a ventilation property of a mesh shape. The cable backplane connector 210 and the substrate wiring backplane connector 220 are exposed from the wall on the +X side of the substrate box 300. The cooling fans 280A and 280B are supported on an inner wall on the −Z side of the substrate box 300 and the inner side surfaces of the opening portions 230A and 230B, and are provided in the substrate box 300. In the illustrated drawings, only an outline of the substrate box 300 is indicated by a one-dot chain line so that the structure of the CPU substrate 200 accommodated in the substrate box 300 is known.

Next, the arrangement of the cables 270A and 270B relative to the CPU substrate 200 will be described with reference to FIGS. 8A and 8B.

As shown in FIG. 8A, the cable 270A extending from the cable back plane connector 210 is arranged along the front surface of the CPU substrate 200 to a vicinity of the inner side surface 231A of the opening portion 230A in the area 200C interposed between the opening portions 230A and 230B. Next, the cable 270A is bent in a direction (+Y direction) approaching the inner side surface 231A on the front surface of the CPU substrate 200. Next, the cable 270A is bent in a direction (−Z direction) along the inner side surface 231A and is disposed along the inner side surface 231A. Next, the cable 270A is bent from the inner side surface 231A in the direction (−Y direction) of the back surface of the CPU substrate 200, and is further bent in the direction (−X direction) of the connector 260A1. Next, the cable 270A passes between the CPU 240 and the memory 250A along the back surface of the CPU substrate 200, and is arranged up to the position of the connector 260A1 while being orthogonal to the substrate wiring 290A. Then, by coupling the connector 260B1 shown in FIG. 7 to the cable 270A, the CPU 240 is electrically connected to the cable backplane connector 210 via the cable 270A. Since the arrangement of the other pair of cables 270B is similar as the arrangement of the cable 270A described above, a description thereof will be omitted.

Here, in the part of the cable 270A from the front surface of the CPU substrate 200 to the back surface of the CPU substrate 200 through the inner side surface 231A of the opening portion 230A and a part of the cable 270B from the front surface of the CPU substrate 200 to the back surface of the CPU substrate 200 through the inner side surface 231B of the opening portion 230B, for example, the cables 270A and 270B may be brought into close contact with the front surface and the back surface of the CPU substrate 200 and the inner side surfaces 231A and 231B using an adhesive tape, a melting tape, a hot melt, a binding band, or the like around the area 200C through the opening portions 230A and 230B. Accordingly, an air path of the cooling air generated by the cooling fans 280A and 280B is reliably secured, and sufficient cooling can be performed on the CPU 240 and the memories 250A and 250B.

As shown in FIG. 8B, the substrate wiring 290A that connects the CPU 240 and the memory 250B is formed in the inner layer of the CPU substrate 200, and the cable 270B is disposed along the back surface of the CPU substrate 200. In FIGS. 8A and 8B, three sets of six substrate wirings 290A with two substrate wirings as one set are illustrated, and for example, each set of the substrate wirings 290A are formed in a respective one of different layers in a plurality of layers constituting the CPU substrate 200. Since the cables 270A and 270B are disposed on the back surface of the CPU substrate 200, the thickness of the CPU substrate 200 can be reduced.

FIG. 9A is a plan view showing a CPU substrate 200 shown as a comparative example of the CPU substrate 200 shown in FIG. 8A as viewed from the front surface side toward the back surface side. The illustrated CPU substrate 200 has a structure in which substrate wirings 290C and 290D are formed in an inner layer of the CPU substrate 200 instead of the cables 270A and 270B.

FIG. 9B is a cross-sectional view of a surface of the CPU substrate 200 in FIG. 9A taken along a line E-E, as viewed toward the +Y side. The substrate wirings 290C and 290D in FIG. 9A are formed in similar paths as the cables 270A and 270B in FIG. 8A in the inner layer of the CPU substrate 200, and the connectors 260A1, 260A2, 260B1, and 260B2 shown in FIG. 7 are not provided.

As shown in FIG. 9B, each two substrate wirings 290A are formed, for example, in a respective one of different layers of the inner layer of the CPU substrate 200, and the substrate wiring 290D is formed, for example, in a manner of being sandwiched between layers in which the respective two substrate wirings 290A are formed. In this way, since all of the substrate wirings 290A, 290C, and 290D are formed in the inner layer of the CPU substrate 200, the thickness of the CPU substrate 200 is increased, which leads to an increase in a manufacturing cost of the CPU substrate 200. On the other hand, the CPU substrate 200 shown in FIG. 8A can be made thinner than the CPU substrate 200 shown in FIG. 9A, and the manufacturing cost can be reduced.

FIG. 10 is a cross-sectional view of a cross section of the CPU substrate 200 in FIG. 8A taken along a line D2-D2, as viewed toward the +Y side, and is a diagram showing a connection relationship between the CPU 240 and the connector 260A2.

As shown in the same figure, the cable 270B is disposed along the back surface of the CPU substrate 200 in the mounting area 200B of the CPU substrate 200. Here, since the integrated circuit, other electronic components, the heat radiation fins 400, and the like are not disposed on the back surface of the mounting area 200B of the CPU substrate 200, the cable 270B can be disposed with the shortest length from the cable backplane connector 210 to the connector 260A2. Similar configuration applies to the cable 270A disposed between the cable backplane connector 210 and the connector 260A1. In this way, in the CPU substrate 200 shown in FIG. 8A, since lengths of the cables 270A and 270B from the cable backplane connector 210 to the connectors 260A1 and 260A2 can be minimized, the transmission loss of the signal transmitted from the cable backplane connector 210 to the CPU 240 can be effectively reduced.

On the back surface of the CPU substrate 200, the connector 260A2 is provided in the vicinity of the CPU 240. The CPU 240 is electrically connected to a through hole 240A2 provided directly below the mounting surface of the CPU 240 on the front surface of the CPU substrate 200, and the connector 260A2 is electrically connected to the through hole 240A2 via a substrate wiring 290E on the back surface of the CPU substrate 200. That is, the CPU 240 and the connector 260A2 are electrically connected to each other through the through hole 240A2 and the substrate wiring 290E. In this way, the substrate wiring 290E only needs to connect the through hole 240A2 and the connector 260A2 on the back surface of the CPU substrate 200, and a length of the substrate wiring 290E can be reduced. The substrate wiring between the through hole 240A1 and the connector 260A1 can also be shortened similarly as the substrate wiring 290E. Therefore, the transmission loss of the signal between the CPU 240 and the connectors 260A1 and 260A2 can be reduced to the minimum limit. Since the CPU 240 and the connector 260A2 are electrically connected between the front surface and the back surface of the CPU substrate 200 using one through hole 240A2, a stub can be shortened as much as possible. Similar configuration applies to the through hole 240A1 that electrically connects the CPU 240 and the connector 260A1. Therefore, the deterioration of the signal quality between the CPU 240 and the connectors 260A1 and 260A2 can be prevented.

FIG. 11 is a cross-sectional view showing the CPU substrate 200 shown as a comparative example of the CPU substrate 200 shown in FIG. 10. In the CPU substrate 200 shown in FIG. 10, the connector 260A2 shown in FIG. 10 is provided on the front surface of the CPU substrate 200. The connector 260A1 is also provided on the front surface of the CPU substrate 200 similarly as the connector 260A2.

In the mounting area 200B on the front surface of the CPU substrate 200, integrated circuits such as the CPU 240 and the memories 250A and 250B, electronic components other than the integrated circuits, the heat radiation fins 400, and the like (hereinafter, may be collectively referred to as "mounted components") are densely mounted. Therefore, it is necessary to provide the connectors 260A1 and 260A2 in a manner of avoiding interference with the above-described mounted components. In the CPU substrate 200 according to the comparative example, the connectors 260A1 and 260A2 are provided at the −X side end of the front surface of the CPU substrate 200. The connectors 260A1 and 260A2 are provided outside a peripheral edge of the heat radiation fin 400 in order to avoid interference with the heat radiation fin 400.

Although when the connectors 260A1 and 260A2 are provided on the front surface of the CPU substrate 200 as described above, the cables 270A and 270B are arranged on the front surface of the CPU substrate 200, on the front surface of the CPU substrate 200, the mounted components are mounted with the cooling fans 280A and 280B respectively protruding from the opening portions 230A and 230B. Therefore, the cables 270A and 270B need to be arranged, for example, along any one of the three sides which are the +Y side, the −Y side, and the −X side of the CPU substrate 200 in a manner of not interfering with the cooling fans 280A and 280B and the above-described mounted components, the lengths of the cables 270A and 270B are larger than the lengths of the cables 270A and 270B according to the present embodiment in FIG. 10, and the transmission loss is larger than that in the case in FIG. 10.

When the connector 260A2 and the CPU 240 are electrically connected, for example, two through holes 410B and 420B and substrate wirings 430B and 440B are used. The through hole 410B is formed near the CPU 240 (+X side) of the connector 260A2. The through hole 420B is formed immediately below (on the −Z side of) the mounting surface of the CPU 240. The substrate wiring 430B is provided between the connector 260A2 provided on the front surface of the CPU substrate 200 and the through hole 410B. The substrate wiring 440B is formed in any layer of the inner layer of the CPU substrate 200 in a manner of electrically connecting the through holes 410B and 420B. Then, the connector 260A2 is electrically connected to the CPU 240 by connecting the connector 260A2 to the substrate wiring 430B and connecting the CPU 240 to the through hole 420B. The connector 260A1 is also electrically connected to the CPU 240 in a similar manner.

Here, however, stubs 411B and 421B, which are unnecessary when the CPU 240 and the connector 260A2 are electrically connected to each other, are generated in the through holes 410B and 420B, respectively, and the quality of a signal transmitted by the cable 270B is deteriorated. The quality of the signal transmitted by the cable 270A is also deteriorated in a similar manner. On the other hand, as shown in FIG. 10, when the connectors 260A1 and 260A2 are arranged on the back surface of the CPU substrate 200, the stubs of the through holes 240A1 and 240A2 can be reduced as short as possible, and deterioration of the quality of signals transmitted through the cables 270A and 270B can be prevented.

In this way, in the case of the configuration in FIG. 10, the transmission loss can be reduced more effectively than that in the case in FIG. 11.

FIGS. 12A and 12B are perspective views of an air guiding plate 500A used in the CPU substrate 200 in FIG. 8. FIG. 13A is a plan view showing the CPU substrate 200 shown in FIG. 8A, on which the air guiding plate 500A shown in FIG. 12A and the air guiding plate 500B shown in FIG. 12B are mounted, as viewed from the front surface side toward the back surface side. FIG. 13B is an overall perspective view showing a state in which the air guiding plates 500A and 500B are mounted on the CPU substrate 200 in FIG. 8A. FIG. 14 is a perspective view showing a periphery of the air guiding plate 500B mounted on the CPU substrate 200.

As shown in FIGS. 13A and 13B, the air guiding plate 500A is disposed in the opening portion 230A. By providing the air guiding plate 500A, the cooling air can be efficiently guided from the back surface to the front surface of the CPU substrate 200.

As shown in FIGS. 12A and 12B, the air guiding plate 500A includes an inclined plate portion 510A, a horizontal plate portion 520A, a cable holding portion 530A, and fixing portions 540A and 550A. The inclined plate portion 510A is a rectangular flat plate, and extends obliquely upward from a mounting area 200A side (+X side) toward a mounting area 200B side (-X side) in the opening 230A such that air on the back surface of the CPU substrate 200 is directed toward the mounting area 200B on the front surface. The horizontal plate portion 520A is a rectangular flat plate, and extends horizontally from a side of the inclined plate portion 510A, which is close to the surface (+Z side) of the CPU substrate 200, toward the mounting area 200B side. The cable holding portion 530A is a plate having a trapezoidal cross section, extends horizontally from the horizontal plate portion 520A in the direction (-Y side) of the area 200C shown in FIG. 8, and the cable 270A is sandwiched and held between the cable holding portion 530A and the area 200C such that the cable 270A is in close contact in the area 200C.

The fixing portion 540A is a rectangular flat plate, extends horizontally from a side of the cable holding portion 530A on the mounting area 200A side (+X side), and fixes the air guiding plate 500A to the area 200C. The fixing portion 540A has a hole 560A, and is fixed to the area 200C by passing a pin 580A through the hole 560A. Similarly, the fixing portion 550A is a rectangular flat plate, extends horizontally from a side of the cable holding portion 530A on the mounting area 200B side (-X side), and fixes the air guiding plate 500A to the area 200C. The fixing portion 550A has a hole 570A, and is fixed to the area 200C by passing a pin 590A through the hole 570A.

As shown in FIG. 12B, the air guiding plate 500B is a member disposed in the opening portion 230B, and acts to guide the cooling air from the back surface of the CPU substrate 200 toward the front surface of the CPU substrate 200. The air guiding plate 500B has a shape symmetrical to the air guiding plate 500A with the direction along the X axis of the area 200C shown in FIG. 8 as a boundary. An inclined plate portion 510B, a horizontal plate portion 520B, a cable holding portion 530B, and fixing portions 540B and 550B constituting the air guiding plate 500B are similar as the inclined plate portion 510A, the horizontal plate portion 520A, the cable holding portion 530A, and the fixing portions 540A and 550A constituting the air guiding plate 500A, respectively, and thus the description thereof will be omitted. By passing a pin 580B through a hole 560B of the fixing portion 540B and passing a pin 590B through a hole 570B of the fixing portion 550B, the air guiding plate 500B is fixed to the area 200C while holding the cable 270B such that the cable 270B is in close contact with the area 200C.

The air guiding plates 500A and 500B are formed by, for example, punching and bending a metal plate. For example, the air guiding plates 500A and 500B may be integrally molded by a die using a resin material.

FIG. 15 is a cross-sectional view showing the CPU substrate 200 shown in FIG. 13A taken along a line F-F (a cross-sectional view as viewed from the -Y direction). As shown in the same figure, air on the back surface side of the CPU substrate 200 passes through space portions 600A and 600B formed on the mounting area 200A side relative to the inclined plate portions 510A and 510B in the opening portions 230A and 230B, and is guided as the cooling air to the front surface side of the CPU substrate 200 along +Z side surfaces of the inclined plate portions 510A and 510B facing the front surface side of the CPU substrate 200. See arrows in FIG. 15. Here, since no heat generating component is provided on the back surface of the CPU substrate 200, the air on the back surface of the CPU substrate 200 has a lower temperature than the air on the front surface of the CPU substrate 200, and the air having the lower temperature is guided to the blade portions 281A and 281B of the cooling fans 280A and 280B along the surfaces of the inclined plate portions 510A and 510B. The cables 270A and 270B are fixed in close contact with the area 200C by the air guiding plates 500A and 500B, respectively, and the cables 270A and 270B do not interfere with the air path of the cooling air formed by the air guiding plates 500A and 500B. Therefore, the mounted components in the mounting area 200B can be effectively cooled.

FIG. 16 is a cross-sectional view showing a case in which a fixing plate 700B that brings the cable 270B into close contact with the back surface of the CPU substrate 200 and fixes the cable 270B is mounted in the structure in FIG. 15. The fixing plate 700B corresponds to a shape obtained by removing the inclined plate portion 510B and the horizontal plate portion 520B from the air guiding plate 500B, and includes a cable holding portion 710B and fixing portions 720B and 730B. The cable holding portion 710B is, for example, a plate having a trapezoidal cross section, and functions to sandwich and hold the cable 270B between the cable holding portion 710B and the back surface of the CPU substrate 200 on a side opposite to the cable holding portion 530B. The fixing portion 720B is a rectangular flat plate, extends horizontally from a side of the cable holding portion 710B on the mounting area 200A side, and fixes the fixing plate 700B to the back surface. The fixing portion 730B is a rectangular flat plate, extends horizontally from a side of the cable holding portion 710B on the mounting area 200B side, and fixes the fixing plate 700B to the back surface of the CPU substrate 200. The fixing portion 720B has a hole 740B, and the fixing portion 730B has a hole 750B. The fixing plate 700B is fixed to the back surface of the CPU substrate 200 by respectively passing a pin 760B and a pin 770B through the hole 740B and the hole 750B. A fixing plate 700A (not shown) that brings the cable 270A into close contact with the back surface of the CPU substrate 200, fixes the cable 270A, and has a similar configuration as that of the fixing plate 700B is provided on the back surface of the CPU substrate 200. According to the above configuration, the cables 270A and 270B can be brought into close contact with the front surface and the back surface of the CPU substrate 200 and fixed at positions where the cables 270A and 270B are arranged from the front surface of the CPU substrate 200 to the back surface of the CPU substrate 200 along the inner side surface 231A of the opening portion 230A and the inner side surface 231B of the opening portion 230B, respectively. Accordingly, the cooling air can be efficiently circulated and the mounted components in the mounting area 200B can be effectively cooled.

FIG. 17 shows a modification of the air guiding plate 500B shown in FIG. 15. An illustrated air guiding plate 800B includes an inclined plate portion 810B and a horizontal plate portion 820B instead of the inclined plate portion 510B and the horizontal plate portion 520B of the air guiding plate 500B. The inclined plate portion 810B is a rectangular plate, and extends obliquely to a predetermined position in a direction away from the CPU substrate 200 relative to the cable holding portion 530B. The horizontal plate portion 820B is a rectangular plate and extends horizontally from a side of the inclined plate portion 810B on the mounting area 200B side to a predetermined position. The air guiding plate 800B is disposed such that the side (−Z side) opposite to the side on which the horizontal plate portion 820B is provided on one surface of the inclined plate portion 810B facing the front surface side of the CPU substrate 200 abuts against the inner side surface 231B of the opening portion 230B on the mounting area 200A side. That is, in the example, the space portion 600B as shown in FIG. 15 is not formed, and the air on the back surface side of the CPU substrate 200 is guided as cooling air to the front surface side of the CPU substrate 200 along the surfaces of the inclined plate portion 810B and the horizontal plate portion 820B that face the back surface side of the CPU substrate 200. The opening portion 230A is provided with an air guiding plate 800A (not shown) having a configuration symmetrical to the air guiding plate 800B relative to the area 200C. According to the above configuration, the air on the back surface side of the CPU substrate 200 can be efficiently guided to the cooling fans 280A and 280B, and the mounted components in the mounting area 200B can be effectively cooled.

FIG. 18 shows a different arrangement example of the air guiding plate 500B shown in FIG. 15. In FIG. 18, the cooling fan 280B is provided on the mounting area 200A side in the opening portion 230B, and the air guiding plate 500B is provided on the mounting area 200B side in the opening portion 230B. A space portion 610B through which air is guided from the back surface of the CPU substrate 200 to the front surface of the CPU substrate 200 is formed between the cooling fan 280B and the air guiding plate 500B. The cooling fan 280A is provided on the mounting area 200A side in the opening portion 230A, and the air guiding plate 500A is provided on the mounting area 200B side in the opening portion 230A. According to the configuration shown in the same figure, the air on the back surface of the CPU substrate 200 is guided to the front surface side of the CPU substrate 200 along the upper surfaces of the inclined plate portion 510A of the air guiding plate 500A of the CPU substrate 200 and the inclined plate portion 510B of the air guiding plate 500B of the CPU substrate 200 by a negative pressure generated by the flow of the cooling air sent out from the cooling fans 280A and 280B, and the mounted components in the mounting area 200B can be effectively cooled.

As described above, the wiring substrates (the CPU substrate 200 and the expansion substrate 130) according to the present embodiment include: first connectors (the cable backplane connector 210 and the substrate wiring backplane connector 220) that are mounted on one surface (front surface) of the wiring substrate and are connected to the backplane 110; opening portions 230A and 230B that are formed in the one surface on a side opposite to a side connected to the backplane 110 of the first connector, and through which cables 270A and 270B having one ends connected to the first connector are passed; integrated circuits (the CPU 240, the memory 250A and 250B, and the like) that are mounted on the one surface on a side opposite to a side on which the first connector is present relative to the opening portions 230A and 230B; and a second connector that is mounted on the other surface (back surface) on a side opposite to the one surface in the vicinity of the above-described integrated circuit on the side opposite to the side on which the first connector is present relative to the opening portions 230A and 230B, is connected to the above-described integrated circuit via through holes 240A1 and 240A2 penetrating the wiring substrate, and is connected to the other ends of the cables 270A and 270B. The wiring substrate according to the present embodiment is a cable that electrically connects the cable backplane connector 210 to the CPU 240, and cables 270A and 270B having a transmission loss smaller than that of the substrate wiring formed in the inner layer of the CPU substrate 200 are used. Parts from the opening portions 230A and 230B of the cables 270A and 270B to the connectors 260A1 and 260A2 are disposed on the back surface of the CPU substrate 200 where no (or few) mounted components is present. Therefore, the connectors 260A1 and 260A2 can be provided in the vicinity of the CPU 240 on the back surface of the CPU substrate 200, and the lengths of the cables 270A and 270B from the cable backplane connector 210 to the connectors 260A1 and 260A2 can be minimized. Therefore, transmission loss and quality degradation of a signal from the cable backplane connector 210 to the CPU 240 can be effectively reduced.

In the wiring substrate according to the present embodiment, since no through hole is provided for the connection between the cable backplane connector 210 and the cables 270A and 270B, the influence of the crosstalk caused by the through hole when a signal is transmitted using the cables 270A and 270B can be reduced.

According to the wiring substrate in the present embodiment, the connectors 260A1 and 260A2 can be mounted in the vicinity of the CPU 240, and the length of the substrate wiring 290E connecting the connectors 260A1 and 260A2 and the CPU 240 can be reduced. Therefore, the transmission loss and the quality degradation of the signal can be effectively reduced.

In the wiring substrate according to the present embodiment, the connectors 260A1 and 260A2 mounted on the back surface of the CPU substrate 200 and the CPU 240 mounted on the front surface of the CPU substrate 200 are electrically connected to each other using the through holes 240A1 and 240A2 therebetween, respectively. Therefore, the stubs of the through holes 240A1 and 240A2 can be made as short as possible, and deterioration of signals between the cable backplane connector 210 and the CPU 240 can be prevented.

In the wiring substrate according to the present embodiment, the cables 270A and 270B are arranged along the back surface of the CPU substrate 200 in a manner of being orthogonal to the substrate wiring 290A connecting the CPU 240 and the memories 250A and 250B. Therefore, an increase in the number of layers of the CPU substrate 200 can be prevented, and the transmission loss and the quality degradation of the signal can be effectively reduced.

In the wiring substrate according to the present embodiment, since the cables 270A and 270B are arranged along the inner side surface 231A of the opening portion 230A and the inner side surface 231B of the opening portion 230B, respectively, the cooling fans 280A and 280B can secure the air path of the cooling air, and do not deteriorate the cooling performance.

In the wiring substrate according to the present embodiment, since the air guiding plates 500A and 500B are disposed on the opening portions 230A and 230B, respectively, the air on the back surface side of the CPU substrate 200 having a lower temperature than the air on the front surface side of the CPU substrate 200 can be efficiently guided from the back surface side of the CPU substrate 200 to the front surface side of the CPU substrate 200. Therefore, the mounted components mounted on the mounting area 200B can be effectively cooled by the cooling air sent out from the cooling fans 280A and 280B.

Since the air guiding plates 500A and 500B have a function of fixing the cables 270A and 270B to the area 200C between the opening portions 230A and 230B, respectively, the air paths of the cooling air generated by the cooling fans 280A and 280B can be reliably secured.

Although the embodiments of the invention have been described above, the invention is not limited to the embodiment described above, and includes various modifications. For example, the embodiments described above have been described in detail for easy understanding of the invention, and the invention is not necessarily limited to those including all the configurations described above. A part of the configuration according to the embodiments can be added to, deleted from, and replaced with another configuration.

What is claims is:

1. A wiring substrate that is connected to a backplane, the wiring substrate comprising:
    a first connector that is mounted on one surface of the wiring substrate and is connected to the backplane;
    an opening portion that is formed in the one surface on a side opposite to a side connected to the backplane of the first connector, and through which a cable having one end connected to the first connector is passed;
    an integrated circuit that is mounted on the one surface on a side opposite to a side on which the first connector is present relative to the opening portion; and
    a second connector that is mounted on the other surface on a side opposite to the one surface in the vicinity of the integrated circuit on the side opposite to the side on which the first connector is present relative to the opening portion, is connected to the integrated circuit via a through hole penetrating the wiring substrate, and is connected to the other end of the cable.

2. The wiring substrate according to claim 1, wherein the cable is provided such that a part of the cable is along an inner side surface of the opening portion.

3. The wiring substrate according to claim 2, wherein the opening portion is provided with a cooling fan configured to send cooling air to cool the integrated circuit.

4. The wiring substrate according to claim 3, wherein an air guiding plate that guides the cooling air from the other surface to the one surface via the opening portion is provided on one of a side of the first connector relative to the cooling fan and a side of the integrated circuit relative to the cooling fan.

5. The wiring substrate according to claim 4, wherein the air guiding plate includes a plate portion extending obliquely relative to an opening surface of the opening portion from the other surface toward the one surface, and a fixing portion that fixes the plate portion in the opening portion, and
    the cooling air is guided from the other surface toward the one surface along a surface on a side of the one surface of the plate portion.

6. The wiring substrate according to claim 4, wherein the air guiding plate includes a plate portion extending obliquely relative to an opening surface of the opening portion from the other surface toward the one surface, and a fixing portion that fixes the plate portion in the opening portion, and
    the cooling air is guided from the other surface toward the one surface along a surface on a side of the other surface of the plate portion.

7. The wiring substrate according to claim 4, wherein the air guiding plate includes a plate portion extending obliquely relative to an opening surface of the opening portion from the other surface toward the one surface, and a fixing portion that fixes the plate portion in the opening portion, and
    the fixing portion fixes the cable along an inner side surface of the opening portion.

8. The wiring substrate according to claim 1, wherein the integrated circuit includes a processor and a memory adjacent to the processor, and
    the cable is disposed in a manner of intersecting with a substrate wiring of the wiring substrate that connects the processor and the memory.

9. A wiring substrate that is connected to a backplane, the wiring substrate comprising:
    an area in which a first connector is mounted on one surface of the wiring substrate and is connected to the backplane;
    an opening portion that is formed in the one surface on a side opposite to a side connected to the backplane of the first connector, and through which a cable having one end connected to the first connector is passed;
    an area in which an integrated circuit that is mounted on the one surface on a side opposite to a side on which the first connector is present relative to the opening portion; and
    an area in which a second connector is mounted on the other surface on a side opposite to the one surface in the vicinity of the integrated circuit on the side opposite to the side on which the first connector is present relative to the opening portion, is connected to the integrated circuit via a through hole penetrating the wiring substrate, and is connected to the other end of the cable.

10. An information processing device comprising:
    the wiring substrate according to claim 1; and
    a backplane that is connected to the wiring substrate.

11. The wiring substrate according to claim 1, wherein the opening portion includes two separate sections and the cable is passed between the two separate sections.

12. The wiring substrate according to claim 9, wherein the opening portion includes two separate sections and the cable is passed between the two separate sections.

* * * * *